United States Patent
Napoli et al.

(10) Patent No.: US 10,219,074 B2
(45) Date of Patent: Feb. 26, 2019

(54) LOUDSPEAKER PROTECTION SYSTEMS AND METHODS

(71) Applicant: Cirrus Logic International Semiconductor Ltd., Edinburgh (GB)

(72) Inventors: Roberto Napoli, Milan (IT); Stefan Williams, London (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/878,659

(22) Filed: Jan. 24, 2018

(65) Prior Publication Data

US 2018/0213322 A1 Jul. 26, 2018

Related U.S. Application Data

(60) Provisional application No. 62/450,321, filed on Jan. 25, 2017.

(51) Int. Cl.
| | | |
|---|---|---|
| *H03G 11/00* | (2006.01) | |
| *H04R 3/00* | (2006.01) | |
| *H03G 3/30* | (2006.01) | |
| *H04R 29/00* | (2006.01) | |
| *G10L 25/21* | (2013.01) | |

(52) U.S. Cl.
CPC ............ *H04R 3/007* (2013.01); *G10L 25/21* (2013.01); *H03G 3/3005* (2013.01); *H04R 29/001* (2013.01); *H04R 29/003* (2013.01); *H04R 2499/11* (2013.01)

(58) Field of Classification Search
CPC .. H04R 3/007; H04R 29/001; H04R 2499/11; H04R 3/00; H04R 9/06; H04R 11/02; H04R 19/02; G10L 25/21; H03G 3/3005
See application file for complete search history.

(56) References Cited

U.S. PATENT DOCUMENTS

| | | |
|---|---|---|
| 2002/0118841 A1 | 8/2002 | Button et al. |
| 2013/0077796 A1 | 3/2013 | Risbo et al. |
| 2013/0083928 A1* | 4/2013 | Williams ............... H03G 7/002 381/55 |

(Continued)

FOREIGN PATENT DOCUMENTS

| | | |
|---|---|---|
| EP | 2538555 A1 | 12/2012 |
| GB | 2522449 A | 7/2015 |
| WO | 2016124896 A1 | 8/2016 |

OTHER PUBLICATIONS

Combined Search and Examination Report, UKIPO, Application No. GB1702762.4, dated Mar. 14, 2017.

(Continued)

*Primary Examiner* — Andrew L Sniezek
(74) *Attorney, Agent, or Firm* — Jackson Walker L.L.P.

(57) ABSTRACT

A method of thermal protection of a voice coil of a loudspeaker comprises: determining an estimate of a temperature of the voice coil, determining an estimate of a rate of change of the temperature of the voice coil, determining an estimate of power dissipation in the voice coil, and generating a gain control signal for modulating a gain applied to an input signal in a signal path between an input terminal and the loudspeaker. The gain control signal is generated as a function of all of the estimate of the temperature of the voice coil, the estimate of the rate of change of the temperature of the voice coil, and the estimate of the power dissipation in the voice coil.

22 Claims, 14 Drawing Sheets

(56) References Cited

U.S. PATENT DOCUMENTS

2014/0169571 A1    6/2014  Polleros
2015/0215704 A1*  7/2015  Magrath ................ H04R 9/022
                                                                          381/55
2016/0157015 A1    6/2016  Van Schyndel

OTHER PUBLICATIONS

International Search Report and Written Opinion of the International Searching Authority, International Application No. PCT/GB2018/050196, dated Mar. 15, 2018.

* cited by examiner

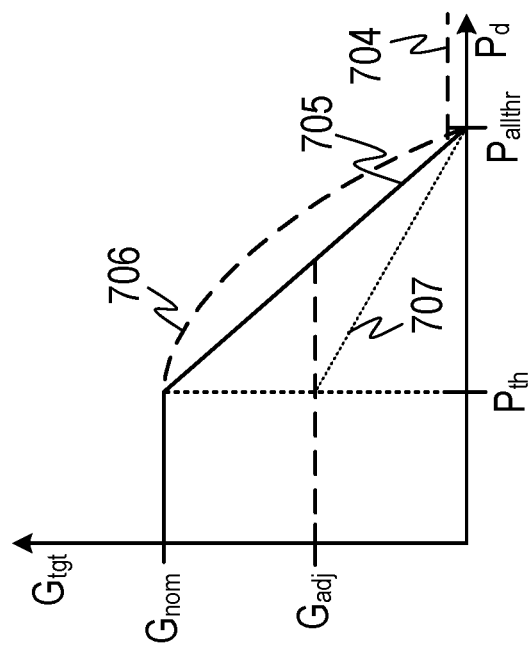
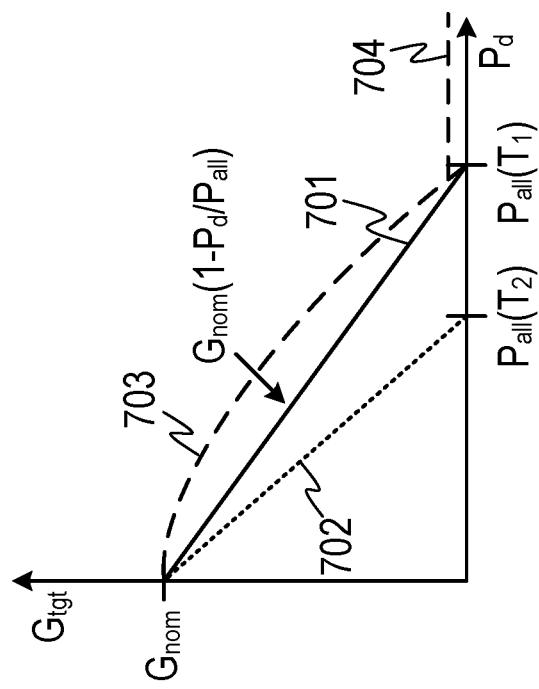
Figure 11b
Figure 11a

LOUDSPEAKER PROTECTION SYSTEMS AND METHODS

FIELD OF DISCLOSURE

This invention relates to methods and apparatus for protecting loudspeakers, and especially to methods and apparatus for controlling the drive signal supplied to the loudspeaker so as to avoid over-temperature operation.

BACKGROUND

A number of different products include audio circuitry, such as an audio amplifier, together with one or more loudspeakers and/or connections for driving one or more loudspeakers of a peripheral apparatus such as a headset. In some instances the loudspeaker(s) chosen will be robust enough and large enough to handle the maximum power level at which the amplifier could drive signals continuously into it, even under the worst case environmental conditions, for instance maximum supply voltage, maximum ambient temperature etc. However, having robust enough loudspeakers is not always economical, and for portable devices in particular the desire is typically to make the speaker as small and light as possible. This can potentially lead to the audio drive circuitry overloading the loudspeaker. One particular problem is thermal overload of the loudspeaker.

A typical loudspeaker comprises a diaphragm which is driven by a voice coil supported relative to a magnet. In use, typically, an analogue audio drive signal is applied to the voice coil to drive the loudspeaker.

FIG. 1a illustrates an electrical model of a loudspeaker voice coil. When a voltage $V_{spka}$ is applied to the voice coil, a current $I_{spka}$ flows. The voice coil impedance observed as defined by $V_{spka}/I_{spka}$ comprises some inductance Lea, but at audio frequencies the ohmic resistance Rea of the coil winding dominates. It will be understood that power Pd is dissipated in the loudspeaker, primarily as ohmic losses ($Pd=I_{spka}^2*Rea=V_{spka}^2/Rea$) in the voice coil which can cause heating of the voice coil.

One particular problem to be avoided is overheating of the voice coil which could result in degradation in performance and/or damage to the loudspeaker. In some applications therefore there may be speaker protection circuitry for controlling the loudspeaker operation to avoid the voice coil temperature exceeding a specified limit.

FIG. 1b illustrates a thermal model of a loudspeaker. The thermal mass of the voice coil is modelled by thermal capacitance $C_{thvc}$ which is at temperature $T_{vc}$ above a reference temperature value $T_{ref}$, say 300K. As mentioned above ohmic power losses can result in heating of the voice coil and thus an increase in the voice coil temperature $T_{vc}$. Power P (modelled as thermal current) flows through a thermal resistance $R_{thvcm}$ to the adjacent magnet and thence via further thermal resistance $R_{thma}$ to the outside world, assumed to be an independently defined ambient temperature $T_a$. The magnet has a thermal inertia represented by thermal capacitance $C_{thm}$, and is at temperature $T_m$ above the reference temperature value $T_{ref}$. It will be appreciated that this is a relatively simple model and more complex models could be developed if required, for instance including other components of the loudspeaker and/or temperature gradients within components such as the magnet.

The audio driving circuitry may therefore be limited in terms of the output power it can deliver to the loudspeaker so that the maximum power dissipated in the voice coil when flowing through the various thermal resistances to the ambient temperature does not cause the voice coil temperature to exceed some specified safe limit. This approach however requires assumptions about the thermal resistances of the voice coil and magnet and the worst case maximum ambient temperature. This will typically lead to conservative values being assumed which may lead to limiting of the output power to undesirably low levels.

Uncertainties in the relevant thermal resistances of the loudspeaker could in some instances be reduced by a measurement/calibration step for instance by extracting a thermal resistance from temperature versus power measurements. However due to the long thermal time constants involved such measurements typically take many seconds to be performed and thus are not typically suitable for self-calibration, e.g. on start-up or reset of a host device. Such a test could be performed as an initial factory calibration but even then would greatly extend production test time and thus increase cost and may not be suitable for a high-volume manufacturing process.

Even if the thermal resistances are well characterised there may be uncertainty about the ambient temperature. The ambient temperature could be measured in use but a single measurement of ambient temperature may be insufficient to take into account thermal gradients in the host device whereas using multiple sensors may add to the complexity and expense of the audio circuitry.

An alternative approach is therefore to measure the voice coil temperature itself with some sort of power limiting applied if a temperature threshold is crossed. This approach has the advantage of working from an actual indication of voice coil temperature but it has been appreciated the limiting applied may result in needless attenuation of some signals in some circumstances as discussed below.

GB-2522449A discloses a system in which a gain control signal is generated as a function both of an estimate of a temperature of the loudspeaker voice coil and of an estimate of power dissipation in the voice coil.

This has several benefits over previous approaches. However, it is now recognised that different signals can have different heating effects when applied to the loudspeaker. For example, while music tends to have properties that make music signals less likely to cause an excessive temperature rise in a loudspeaker, high-frequency sine waves can deliver a constant high power that can be damaging to a loudspeaker.

Again, therefore, in order to prevent loudspeaker damage caused by a signal containing high-frequency sine waves, the loudspeaker system of GB-2522449A may be tuned in a way that is very conservative in order to deal with the possibility of signals containing high-frequency sine waves, and that leads to unnecessary attenuation when music is being played through the loudspeaker. Tuning the system in a way that is appropriate for music may lead to excessive loudspeaker temperatures when sine waves are played.

SUMMARY

Embodiments of the present invention provide methods and apparatus for speaker protection that at least mitigate at least some of the above mentioned disadvantages.

Thus according to the present invention there is provided a method of thermal protection of a voice coil of a loudspeaker comprising:
  determining an estimate of a temperature of the voice coil,
  determining an estimate of a rate of change of the temperature of the voice coil, determining an estimate of power dissipation in the voice coil, generating a gain control signal for modulating a gain applied to an input signal in a signal path between an input terminal and said loudspeaker, wherein the gain control signal is generated as a function of all of said estimate of the temperature of the voice coil, said estimate of the rate of change of the temperature of the voice coil, and said estimate of the power dissipation in the voice coil.

According to another aspect, there is provided a system for thermal protection of a voice coil of a loudspeaker, configured to operate in accordance with the method of the first aspect.

According to another aspect, there is provided a system for thermal protection of a voice coil of a loudspeaker, comprising a processor, configured to:

determine an estimate of a temperature of the voice coil,
determine an estimate of a rate of change of the temperature of the voice coil,
determine an estimate of power dissipation in the voice coil, and
generate a gain control signal for modulating a gain applied to an input signal in a signal path between an input terminal and said loudspeaker,
wherein the gain control signal is generated as a function of all of said estimate of the temperature of the voice coil, said estimate of the rate of change of the temperature of the voice coil, and said estimate of the power dissipation in the voice coil.

According to a further aspect, there is provided an electronic apparatus comprising a system according to the previous aspects. The apparatus may be at least one of: a portable device; a battery power device; a computing device; a communications device; a gaming device; a mobile telephone; a personal media player; a laptop, tablet or notebook computing device.

According to a further aspect, there is provided software code stored on a non-transitory storage medium which, when run on a suitable processor, performs the method of the first aspect.

According to a further aspect, there is provided an electronic device comprising memory containing software code and a suitable processor for performing the method of the first aspect.

According to a further aspect, there is provided software code stored on a non-transitory storage medium, which when run on a suitable processor provides a gain control signal for controlling a gain applied upstream of a loudspeaker for thermal protection, said code comprising instructions to:

determine an estimate of a temperature of the voice coil,
determine an estimate of a rate of change of the temperature of the voice coil,
determine an estimate of power dissipation in the voice coil, and
generate a gain control signal for modulating a gain applied to an input signal in a signal path between an input terminal and said loudspeaker,
wherein the gain control signal is generated as a function of all of said estimate of the temperature of the voice coil, said estimate of the rate of change of the temperature of the voice coil, and said estimate of the power dissipation in the voice coil.

According to a further aspect, there is provided an electronic device comprising memory containing software code according to the previous aspect and a suitable processor for running said code.

According to a further aspect, there is provided a module for thermal protection of a voice coil of a loudspeaker comprising: a gain controller configured to generate a gain control signal for modulating a gain of a signal processing chain driving said loudspeaker, wherein said gain control signal is based on an estimate of temperature of said voice coil, an estimate of a rate of change of the temperature of said voice coil, and an estimate of power dissipation in the voice coil.

According to a further aspect, there is provided a method of operation of a circuit for driving a loudspeaker, wherein the circuit comprises:

an input for receiving an input signal for output to the loudspeaker;
an output for connection to the loudspeaker; and
a gain control circuit for applying a variable gain to the input signal,
the method comprising:
estimating a rate of change of a temperature of a voice coil of the loudspeaker; and
controlling the variable gain applied to the input signal, based on the estimated rate of change of the temperature.

According to a further aspect, there is provided a system comprising a circuit for driving a loudspeaker, wherein the circuit comprises:

an input for receiving an input signal for output to the loudspeaker;
an output for connection to the loudspeaker; and
a gain control circuit for applying a variable gain to the input signal,
the system being configured to:
estimate a rate of change of a temperature of a voice coil of the loudspeaker; and
control the variable gain applied to the input signal, based on the estimated rate of change of the temperature.

According to a further aspect, there is provided an electronic apparatus comprising such a system.

The electronic apparatus may be at least one of: a portable device; a battery power device; a computing device; a communications device; a gaming device; a mobile telephone; a personal media player; a laptop, tablet or notebook computing device.

According to a further aspect, there is provided software code stored on a non-transitory storage medium which, when run on a suitable processor, performs the method of the further aspect.

BRIEF DESCRIPTION OF THE DRAWINGS

Embodiments of the invention will now be described, by way of example only, with reference to the accompanying drawings, of which:

FIGS. 11a, 11b, and 11c illustrate various forms of possible transfer functions between gain modulation and estimated power dissipation based on the determined maximum allowed power;

DETAILED DESCRIPTION

As mentioned above, FIG. 1b illustrates a thermal model of a typical loudspeaker which explains how the output power from the audio driving circuitry can lead to an increase in the temperature of the voice coil. It will be understood that the various thermal time constants for the components of the model, i.e. the components of the loudspeaker, may be quite different.

Audio signals are conventionally in the range of about 20 Hz-20 kHz with corresponding time constants of the order of 10 ms to 10 μs. The output audio power is usually determined over a plurality of cycles of the instantaneous audio signal but still within a period typically less than about 100 ms or so. It will be appreciated that for an audio track the amplitude of the input signal, i.e. the relative loudness of the intended sound signal, may vary throughout the track. For instance an audio track may have relatively louder and relatively quieter periods and may transition from quiet to loud, or vice versa, relatively quickly. In general then the amplitude of the audio drive signal (or the envelope of this signal) which is supplied to drive the loudspeaker may change relatively quickly and thus the power dissipated in the voice coil may also vary relatively quickly.

The thermal time constants of the speaker elements will however typically be much slower than the possible changes in the current and/or voltage, i.e. audio power, applied to the loudspeaker. The thermal time constant of the voice coil may generally be of the order of a few seconds or so, whereas the bulkier magnet may have a greater mass and thus a thermal time constant of more like tens of seconds. Clearly the exact thermal time constants and their relative values may vary depending on the actual loudspeaker construction or variations in manufacture of a particular loudspeaker.

Figure 1B:
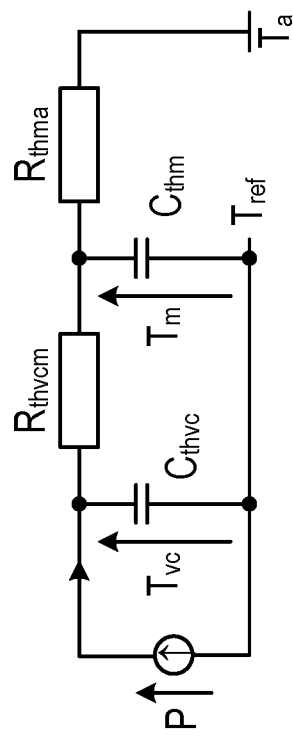
FIGS. 1a and 1b illustrate electrical and thermal models of a loudspeaker.
Figure 1A:
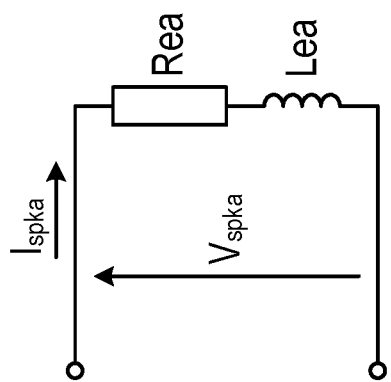
Figure 2:
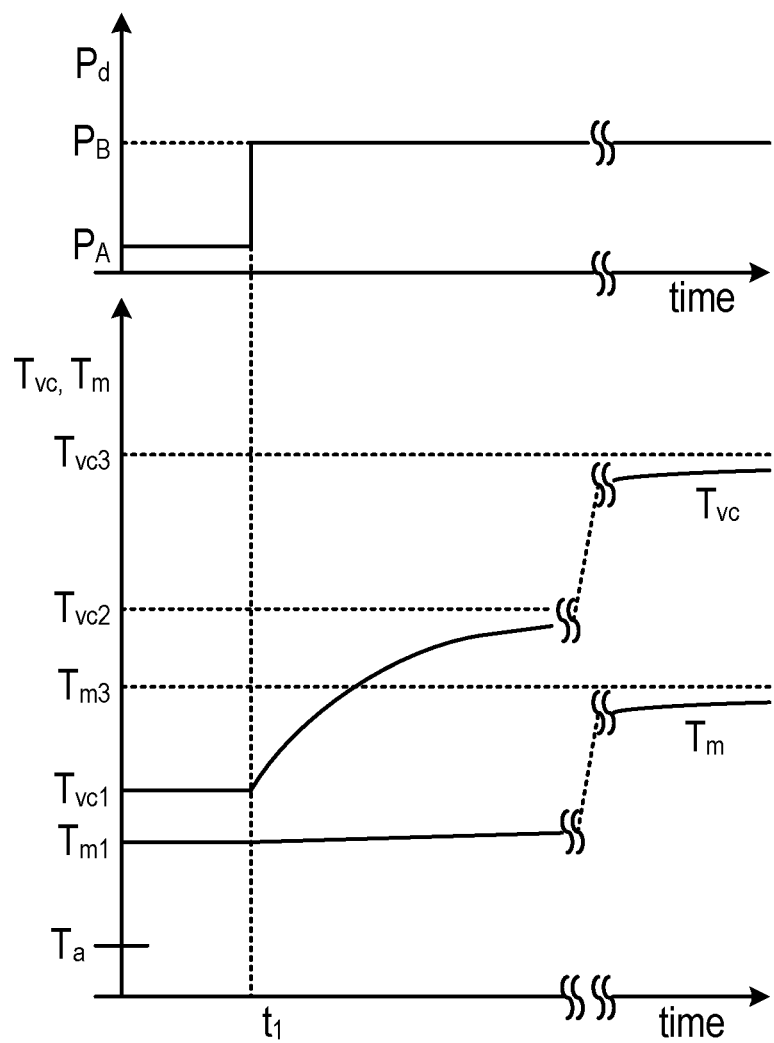
FIG. 2 illustrates increases in the temperature of the voice coil and magnet following an increase in power in the model of FIG. 1.

FIG. 2 illustrates the response of the model of FIG. 1b to an increase in power, and specifically, by way of example, to an increase in the drive signal amplitude, resulting in a change in power dissipated in the speaker from an initial low power $P_A$ to a fixed higher power $P_B$. FIG. 2 illustrates the power dissipated in the loudspeaker $P_d$ against time and also the temperature of various parts of the model against time, in this example.

It will be appreciated that, for signals representing music, or for signals with a high crest factor, the power dissipated in the speaker is likely to fluctuate, and so increases in temperature will be slower than illustrated in FIG. 2, but FIG. 2 still usefully shows the thermal response of the system in one particular situation.

It is assumed in FIG. 2 that the loudspeaker is initially in thermal steady-state. Initially therefore the voice coil and magnet are at steady-state temperatures $T_{VC1}$ and $T_{m1}$ defined by the thermal resistance to $T_a$ and by $P_A$ (i.e. $T_{VC1}=P_A \cdot (R_{thvcm}+R_{thma})$ and $T_{m1}=P_A \cdot R_{thma}$ respectively).

FIG. 2 illustrates that, at time $t_1$, the power dissipated in the voice coil increases. On the timescales as shown in FIG. 2 this increase in power can be seen as sudden step change in power from $P_A$ to $P_B$. This consequently leads to increased heating of the voice coil. The temperature of the voice coil $T_{VC}$ thus starts to increase. Typically however the thermal mass of the magnet is much greater than that of the voice coil and thus the temperature of the magnet $T_{m1}$ initially stays relatively constant. The temperature of the voice coil $T_{vc}$ increases towards an asymptote of $T_{vc2}=P_B \cdot R_{thvcm}+T_{m1} \ T_{m1}$ with a thermal time constant $\tau_{vc}=R_{thvcm} \cdot C_{thvc}$.

Eventually the thermal capacitance $C_{thvc}$ of the voice coil is almost charged up to $T_{vc2}$ and most of the dissipated power (thermal current) then flows into the larger magnet thermal capacitance. At this point the temperature of the magnet will start to increase towards an asymptote $T_{m3}=P_B \cdot R_{thma}$. This increase in temperature will have a longer time constant and thus FIG. 2 shows only the temperature nearing the asymptote for clarity. As the temperature of the magnet increases the rate of change of voice coil temperature will decrease and the temperature difference of the voice coil over the magnet will approach $P_B \cdot R_{thvcm}$, thus the voice coil temperature will approach an asymptotic temperature $T_{VC3}=P_B \cdot (R_{thvcm}+R_{thma})$ where the thermal capacitances are charged up to their steady-state temperatures and all the thermal current flows through the thermal resistances.

It will be appreciated that if the ambient temperature $T_a$ were to be higher (e.g. by $\Delta T_a$) then the whole family of curves would rise by an amount $\Delta T_a$, giving a larger temperature and hence reaching any fixed temperature threshold more quickly. It will be appreciated the ambient temperature experienced by the magnet may be determined by several independent paths into the case or chassis of the host device and, for example factors such as whether it is hand-held, or in a docking station, lying in particular orientation, exposed to direct sunlight etc.

Given the relatively long thermal time constants of the loudspeaker components, and the fact that the audio power dissipated may be reduced much more quickly, it is possible to allow the audio drive circuitry to generate short term output signals of a magnitude that is significantly larger than would be advisable in continuous operation but without exceeding a voice coil temperature limit.

For example consider that the voice coil temperature should not exceed a first temperature limit $T_{max}$ and that the value of the asymptote temperature $T_{vc1}$ is greater than this first temperature limit $T_{max}$, i.e. in other words for a given ambient temperature $T_a$ long term operation with an audio power level $P_B$ would lead to the voice coil temperature exceeding $T_{max}$. It has been appreciated that it would be possible to operate at audio output power level $P_B$ for at least a certain period of time without the voice coil exceeding $T_{max}$, provided that the output power is then reduced to a lower level.

As mentioned above it is possible to determine the temperature of the voice coil of the loudspeaker and apply limiting to the drive signal, for example applying a gain modulation to attenuate the drive signal, if the voice coil temperature approaches the first limit $T_{max}$, for example if some temperature threshold $T_{th}$ somewhat lower than $T_{max}$ is crossed. In some instances the gain modulation applied may be a function of the determined voice coil temperature so that the higher the voice coil temperature the greater the gain reduction applied. In this way the drive signal may be modulated to ensure that the power dissipated in the voice coil is reduced as the voice coil temperature increases.

It has been appreciated that this may lead to unnecessary limiting in some instances. For instance, if the temperature of the voice coil is above a threshold, this approach leads to a gain reduction being applied until the temperature reduces. If however the input audio signal drops to a signal level that would, in the absence of the gain reduction only lead to a power dissipation of $P_A$ that is low enough not to cause the temperature limit $T_{max}$ to be exceeded even if it were applied permanently, it may no longer be necessary to apply any gain modulation. However until the voice coil temperature has reduced below the threshold the signal would still in fact suffer a reduction in gain, unnecessarily.

Moreover, the temperature threshold $T_{th}$ must be set so that, when the drive signal is of a type that causes rapid heating of the voice coil, the gain reduction can prevent the temperature from reaching the limit $T_{max}$. However, this means that a gain reduction is applied whenever the temperature reaches this threshold $T_{th}$ even though, for other types of drive signal (such as music signals), the power dissipation would not cause the temperature to reach the limit $T_{max}$.

Embodiments of the present invention therefore determine an estimate, i.e. an indication, of both the power dissipation of the voice coil, i.e. load, the temperature of the voice coil, and the rate of change of the temperature of the voice coil, in order to determine the level of any gain modulation that is to be applied to an input signal for the purposes of thermal protection of the voice coil and hence the loudspeaker.

Determining estimates of the voice coil power dissipation, the voice coil temperature, and the rate of change of the voice coil temperature, i.e. deriving or calculating indicative values of the power dissipation, temperature and rate of change of temperature, allows appropriate gain modulation to be applied to the audio drive signal. From these estimates a gain control signal is generated as a function of the estimated power dissipation, the estimated temperature, and the estimated rate of change of the temperature. The gain control signal controls modulation of a gain applied to the input signal which is used to drive the loudspeaker, the gain being applied in the signal path between an input terminal or node for receiving the input signal and the loudspeaker.

To estimate the voice coil power dissipation and voice coil temperature, the drive voltage applied to the loudspeaker and the current flowing in the voice coil are monitored. Thus estimating the voice coil power dissipation and voice coil temperature comprises deriving or calculating indicative values of the power dissipation and temperature from the monitored voltage and current values. The voice coil temperature is estimated by estimating the voice coil resistance based on the monitored values of current and voltage. The rate of change of the voice coil temperature is estimated from successive estimates of the voice coil temperature.

Figure 3A:
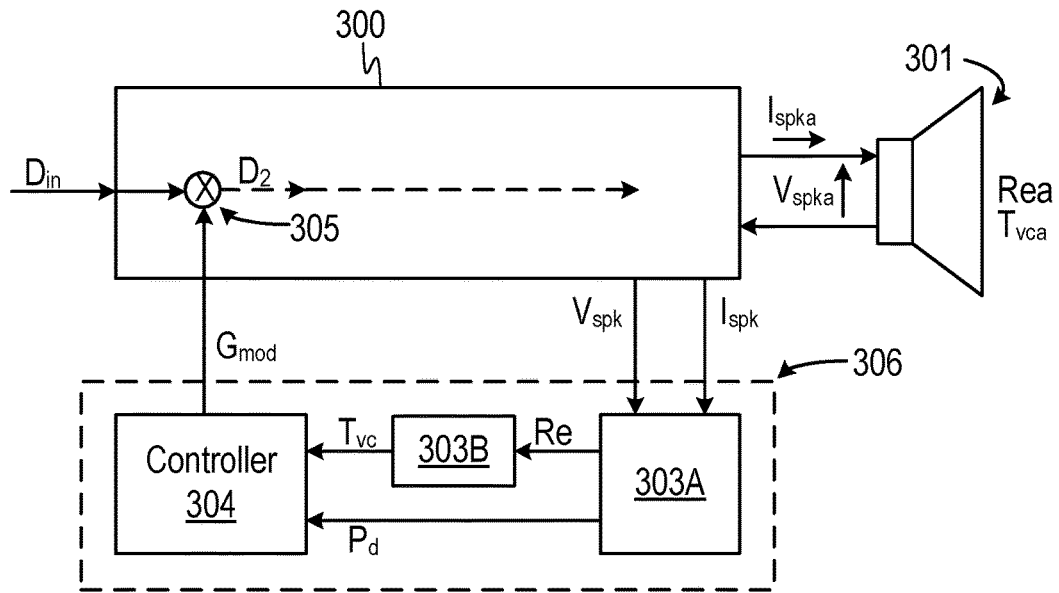
FIGS. 3a and 3b illustrate an embodiment of speaker protection circuitry according to the present invention.

FIG. 3a illustrates an embodiment of the invention. Signal processing chain 300 receives a digital input audio signal $D_{in}$ at an input terminal and processes it, eventually providing a signal to drive a loudspeaker 301. The input terminal may be a circuit contact such as bond pad or the like for connecting to another circuit or could simply be a node of a signal path which represents the input to the signal processing chain. For the avoidance of doubt the phrase "input terminal" as used herein includes an input node and no particular physical characteristics are implied by the word "terminal". The signal processing chain comprises a multiplier or digital gain stage 305 in the signal path and may also comprise elements such as digital filtering or other digital signal processing, digital-to-analogue convertors, and/or at least one Class D, Class AB or Class G or Class H power amplifier stage and associated modulation circuitry. The signal processing chain will have an overall gain from the input signal $D_{in}$ to the voltage signal $V_{spka}$ driven into the loudspeaker.

It should be noted that the digital processing circuitry may comprise at least some custom-designed logic circuitry and/or may comprise a general purpose processor running appropriate code. The loudspeaker may be grounded externally and driven from a single output terminal, or both loudspeaker terminals may be connected to the signal processing chain for example where both terminals are driven in from a full-bridge output stage or where the ground return current is passed through the driver circuitry as illustrated.

The signal processing chain 300 also comprises circuitry for sensing the current $I_{spka}$ actually flowing through the voice coil of the loudspeaker. This current $I_{spka}$ may, for example, be sensed in a power supply or ground return lead, monitored in series with the load, or monitored by sensing current through or voltage across amplifier output elements.

In this embodiment, circuitry in the signal processing chain provides signals $V_{spk}$ and $I_{spk}$ that are indicative of the voice coil drive voltage $V_{spka}$ and voice coil current $I_{spka}$ respectively to loudspeaker protection control module 306. The loudspeaker protection control module 306 receives these indicative signals $V_{spk}$ and $I_{spk}$ and derives an appropriate gain control signal $G_{mod}$ to control the digital gain stage 305 in order to modulate, i.e. reduce or increase, the gain of the signal processing chain so as to modulate the signal applied to the loudspeaker to a safe level. When the indicative voltage and current signals $V_{spka}$ and $I_{spka}$ suggest that there is danger of thermal overload of the loudspeaker the gain applied to the input signal $D_{in}$ is modulated such that it reduces the signal applied to the loudspeaker.

The loudspeaker protection control module 306 comprises power and resistance estimation module 303A, which is arranged to determine, e.g. calculate, an estimate Re of the voice coil resistance of the loudspeaker from the indicative voltage and current signals $V_{spk}$ and $I_{spk}$. The power and resistance estimation module also determines an estimate $P_d$ of the present power dissipation based on the monitored voltage and current signals $V_{spk}$ and $I_{spk}$, either directly from the monitored signals or using the estimated value of resistance Re. The loudspeaker protection control module 306 also comprises temperature estimation module 303B, which calculates, i.e. derives, an estimate $T_{vc}$ of the voice coil temperature from the estimated voice coil resistance Re.

The loudspeaker protection control module 306 further comprises controller 304 which generates the gain control signal $G_{mod}$ based on, i.e. as a function of, the voice coil power dissipation estimate $P_d$ and the voice coil temperature estimate $T_{vc}$, using also an estimate of the rate of change of the voice coil temperature. The controller 304 is able to generate the estimate of the rate of change of the voice coil temperature based on successive values of the voice coil temperature estimate.

In one embodiment, the temperature estimate is updated approximately once every 10 ms. In this embodiment, a temperature measurement is made, and smoothing is applied to reduce measurement noise in order to produce the temperature estimate. The temperature rate of change is then estimated by comparing each temperature estimate with the immediately preceding temperature estimate, with first order smoothing applied to the result of each such comparison, to reduce the effect of noise on temperature estimates and to take into account previous rates of change. The first order smoothing may form a weighted sum of a current comparison value Xnew and a previous comparison value Xold to form a smoothed estimate Xsmooth as:

$$Xsmooth = \alpha * Xold + (1-\alpha) * Xnew$$

where a is a smoothing factor between 0 and 1 that decides the relative weights of the new comparison value and the previous one, and can be modified if needed.

By controlling the smoothing factors applied to the temperature measurements to obtain the temperature estimates, and applied to the temperature estimate comparisons to obtain the estimate of the temperature rate of change, it is possible to make the system more or less sensitive to temperature changes (while also making it more or less sensitive to the effects of noise).

The temperature update rate can be made to be compatible with the fastest thermal time constant of the speaker, so that fast temperature variations can be captured. Where the speaker is a microspeaker, for example, it may have a thermal time constant of the order of 1-2 seconds, and so an update rate of once every 10 ms is sufficient.

In general terms, the controller 304 receives information related to both the power dissipation in the voice coil and the temperature of the voice coil and can, from this information, thus ensure that the correct gain modulation is applied. For speaker thermal protection the gain modulation applied will reduce the magnitude of the driving signal so as to reduce power dissipation. Typically therefore the gain modulation may be a modulation to reduce the overall gain. Thus if the power dissipation is relatively high and/or the voice coil temperature is relatively high and/or the rate of change of the voice coil temperature is relatively high a gain modulation may be applied to reduce the gain applied to the input signal so as to reduce the level of power dissipation. The ways in which these values may be combined, to identify situations in which gain modulation is to be applied, are discussed in detail below.

If the envelope level of the input signal decreases following the application of gain modulation, the power dissipation will also consequently reduce. At this point the controller 304 may partly or fully remove the gain reduction previously applied, thus avoiding needless reduction of the output audio signal. In other words for at least some values of temperature, rate of change of temperature and power dissipation a change in the estimated values can result in an alteration of the gain modulation being applied, either to reduce the magnitude of the drive signal or to increase the magnitude of the drive signal.

Figure 3B:
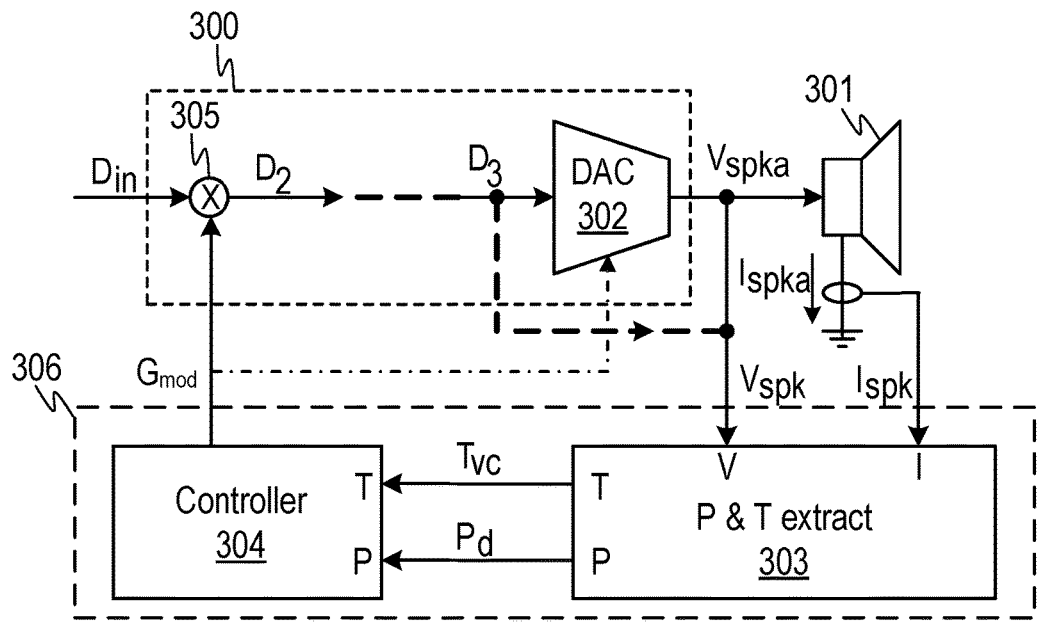

FIG. 3b illustrates in more detail an embodiment of the invention. The loudspeaker 301 is driven by an audio output stage 302 of the signal processing chain 300. In this example the output stage 302 is a digital-to-analogue converter (DAC) that receives a digital signal $D_3$ (which may be the same as the input signal $D_{in}$ scaled by a gain element 305 to provide a signal $D_2$ or a further processed version thereof) and generates an analogue driving signal $V_{spka}$ which is supplied to the voice coil of the loudspeaker 301. It will of course be appreciated that in other embodiments an analogue amplifier could be used to generate the speaker driving signal, possibly downstream from a DAC or which receives an analogue input audio signal. It will also be appreciated that an audio signal processing chain 300 may comprise additional circuit components such as additional gain stages or signal processing stages, e.g. noise shaping stages, which have been omitted from FIG. 3 for clarity. The chain may comprise various classes of power amplifiers including Class AB, Class G or Class D. The loudspeaker may be connected between an amplifier output terminal and a ground return terminal as shown, or both terminals of the speaker may be driven in a full-bridge mode.

As mentioned above the current through the voice coil of the loudspeaker is monitored, and may be sensed in a power supply or ground return lead, monitored in series with the load, or monitored by sensing current through or voltage across amplifier output elements.

In the embodiment illustrated in FIG. 3b, an estimation module, i.e. power and temperature extraction block 303, is arranged to determine an indication or estimate of the voice coil temperature and also an indication or estimate of the present power dissipation of the loudspeaker. In the embodiment illustrated in FIG. 3b both the voice coil temperature and the power dissipation are estimated from the electrical parameters of the audio circuitry, in particular the voice coil current and the applied voice coil voltage signal. The estimation module is therefore configured to receive an indication $I_{spk}$ of voice coil current of the loudspeaker and also an indication $V_{spk}$ of the drive signal voltage applied to the loudspeaker, i.e. the drive voltage applied to the loudspeaker voice coil and the current flowing through the voice coil are monitored.

The determined values of voice coil power dissipation $P_d$ and voice coil temperature $T_{vc}$ are provided to controller 304 which can also calculate from the estimates of the voice coil temperature an estimate of the rate of change of the voice coil temperature, and can then determine whether any gain modulation is required. The controller 304 may generate a gain control signal $G_{mod}$ to control modulation of a gain applied to the input signal $D_{in}$, for example as applied by a gain element 305 and/or any gain applied by the audio output stage 302. The controller 304 can thus ensure that any reduction in gain applied for speaker thermal protection reasons is only applied when required. Thus if the power dissipation is relatively high and the voice coil temperature is also relatively high and/or the rate of change of the voice coil temperature is also relatively high, a gain modulation may be applied to reduce the gain applied to the input signal so as to reduce the level of power dissipation. If one or more of these parameters continues to rise, the gain may be reduced further. If however the parameter values suggest that the maximum temperature will not be exceeded, the controller 304 may adjust the level of gain modulation so as to increase the gain applied, i.e. to partly or fully remove the gain reduction previously applied. Note that, as used herein, the term "reduce the gain" shall be taken to mean modulating the processing applied to vary the resultant signal level so as to reduce the magnitude of the output signal compared to the magnitude of the input signal. Reducing the gain may include reducing the level of any amplification applied (which normally enlarges signal magnitude) and/or increasing the amount of attenuation applied (which normally diminishes signal amplitude). Increasing the gain shall mean the opposite. For the avoidance of doubt the term "amplify" shall be taken to refer generally to controlling the amplitude level of a signal and thus can include attenuating a signal.

The controller 304 may therefore be configured to determine an allowed power limit based on the indication of voice coil temperature and its calculation of the rate of change of the voice coil temperature, and to determine the value of the gain control signal, for modulating the gain applied to the drive signal voltage as a function of the indication of power dissipation in the loudspeaker and the allowed power limit. Thus a greater gain modulation may be applied the closer the estimated value of power dissipation is to the allowed power limit. Together the estimation module 303 and controller 304 comprise loudspeaker protection control module 306.

Figure 4:
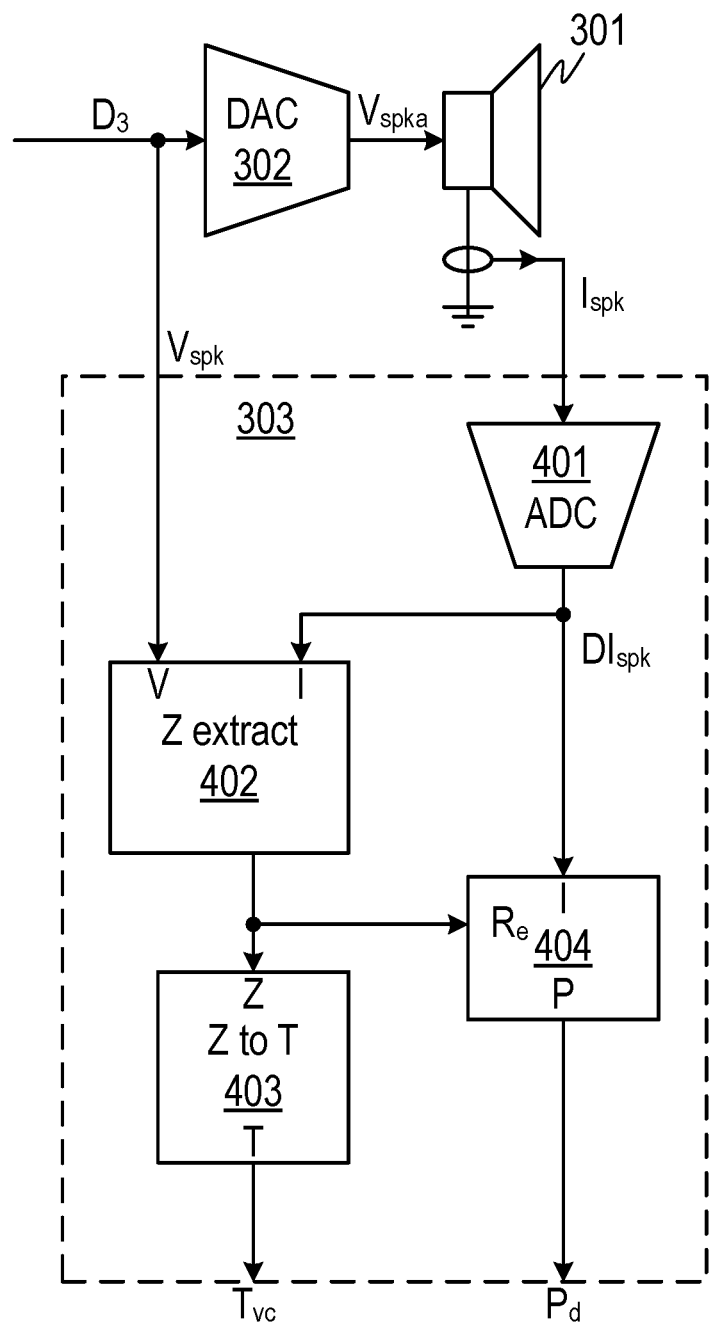
FIG. 4 illustrates one example of suitable temperature and power extraction circuitry.

FIG. 4 illustrates one embodiment of a suitable estimation module, i.e. power and temperature extraction block 303. The voice coil current $I_{spk}$ is monitored by a suitable current sensor as is well known in the art. This current value $I_{spk}$ may be converted to a digital current signal $DI_{spk}$ (i.e. a digital signal indicative of current $I_{spk}$) by an ADC 401 possibly after some pre-processing e.g. analogue filtering, amplification etc. The digital current signal $DI_{spk}$ is provided to an impedance extraction block 402. The impedance extraction block also receives an indication of the applied voltage, i.e. the drive voltage is monitored. In this embodiment the digital signal $D_3$ input to the DAC 302 may be provided as an indication of the voltage of the drive signal $V_{spk}$. In other words monitoring the drive voltage may comprise monitoring the digital signal used to generate the drive signal. However as illustrated in FIG. 3b it would alternatively be possible to monitor the drive signal $V_{spk}$ directly. It would also be possible to use the input signal $D_{in}$ itself together with an indication of the value of the gain control signal and allowing for this and any other gain applied in the signal path.

The impedance extraction block 402 determines an estimate of the present resistance Re of the voice coil, for example based on the relationship $Re = V_{spk}/I_{spk}$, although more sophisticated known techniques such as those involving adapting coefficients of an adaptive filter may be used if desired.

The estimated value of resistance may be used to determine the temperature $T_{vc}$ of the voice coil by temperature estimation block 403. The resistance of the voice coil will have a temperature coefficient that may be known from an initial calibration step or estimated based on the type of loudspeaker used. The temperature coefficient may typically be of the order of about 4000 ppm/K. The variation of the estimated resistance with respect to some reference value, which may for instance be a stored nominal or test calibration value or which may be acquired in a self-calibration routine, for instance on start-up, can be used to determine an estimated temperature of the voice coil. Such a calibration would be purely an electrical measurement, at a single nominal temperature, and so would not require the long measurement times of the order of the thermal time constants required for thermal impedance measurements. If the calibration value is obtained in production test, e.g. of the complete host device or of just a flex circuit comprising the loudspeaker and associated circuitry) the ambient temperature may be well controlled and known. If the calibration is performed every time a user starts up a device or a loudspeaker application, the ambient temperature may be unpredictable, in which case the host device may comprise an independent temperature sensor to provide information on the actual ambient temperature and by implication the present temperature of the voice coil.

The estimate of voice coil resistance is passed to power calculation block 404 which derives an estimate $P_d$ of the power dissipation of the voice coil. The power calculation block, in this embodiment, determines the power dissipated using the digital representation $DI_{spk}$ of the speaker current $I_{spk}$ and the determined resistance based on the relationship $P_d = I_{spk}^2 \cdot Re$. It will be noted that it would alternatively be possible to estimate the power dissipated using the determined resistance and a measured coil voltage based on the relationship $V_{spk}^2/Re$ ($V_{spk}$ may be available with greater accuracy than $I_{spk}$ but there is a computational advantage in the former approach which avoids phase lag issues due to coil inductance in sensing the coil voltage) or directly from the monitored current and voltage values. The power calculation block may calculate the power over a plurality of audio cycles, say over a few tens to hundreds of milliseconds.

The estimated values of temperature and power dissipation are then passed to the controller 304.

Figure 5:
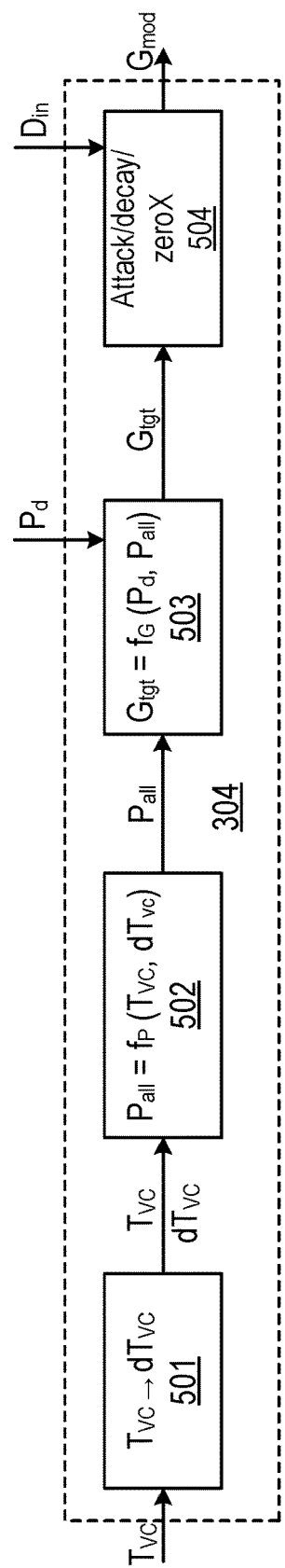
FIG. 5 illustrates one example of suitable control circuitry.

FIG. 5 illustrates one example of a suitable controller 304. The estimated voice coil temperature value $T_{vc}$ is passed to a rate of change calculation block 501. The rate of change of the temperature, $dT_{vc}$, is calculated as the derivative of the temperature signal $T_{vc}$. The sampling time of $T_{vc}$ depends on how often the temperature is calculated from Re, the DC resistance of the loudspeaker 301, and how often the calculated value of Re is updated. The temperature update rate has to be compatible with the fastest thermal time constant of the speaker so that fast temperature variations can be captured.

In calculating the value of the derivative $dT_{vc}$, smoothing can be used to account for noise and to prevent false detection of temperature variation. In general, no additional action is required when the speaker is cooling, and therefore negative values for the rate of change of the temperature can be discarded.

The values of the temperature $T_{vc}$ and of the rate of change of the temperature, $dT_{vc}$, are then received by a power limit block 502 which, based on the present voice coil temperature and rate of change of temperature, determines the maximum short term or instantaneous power dissipation level that is permitted. This maximum allowed power value $P_{all}$ will be determined by a desired first transfer function $fp(T_{vc}, dT_{vc})$, the form of which may vary depending on the particular implementation, but which will generally decrease with increasing temperature and/or with increasing rate of change of temperature, reducing to a level at or near zero at a certain temperature limit $T_{max}$.

A gain calculation block 503 receives the indication of the allowed short-term power level $P_{all}$ and also the estimate of the present level of power dissipation $P_d$. The gain calculation block determines a gain control value, e.g. a target gain $G_{tgt}$, to be applied to the input signal, depending on the estimated present power dissipation, with the aim of keeping the instantaneous power dissipated less than $P_{all}$.

In some embodiments the target gain signal $G_{tgt}$ may be used directly as a gain control signal. In some embodiments however a gain control block 504 may apply some time-domain processing on the target gain signal, for instance to reduce any audio artefacts caused by gain changes. For instance gain changes may only be applied when the input signal crosses zero to avoid steps introduced by gain changes applied to a non-zero part of the signal. The gain control block 504 may therefore also receive the input signal $D_{in}$ and synchronise the gain changes with respect to zero crossings to produce the gain control signal $G_{mod}$.

As mentioned above, in general the allowed power dissipation limit, $P_{all}$, will reduce towards zero as the voice coil temperature $T_{VC}$ reaches a specified maximum voice coil temperature $T_{max}$ for the relevant loudspeaker, which may for instance be based on a recommendation from the loudspeaker manufacturer. This aims to ensure that $T_{vc}$ will never exceed $T_{max}$. However rather than reduce the gain to zero suddenly when $T_{max}$ is reached, for instance by disabling the audio output stage, the gain is preferably gradually wound down (as the magnet slowly heats up) allowing a graceful and less noticeable reduction in signal, but still fast enough relative to the thermal time constants of the speaker to avoid exceeding Tmax.

Figure 6A:
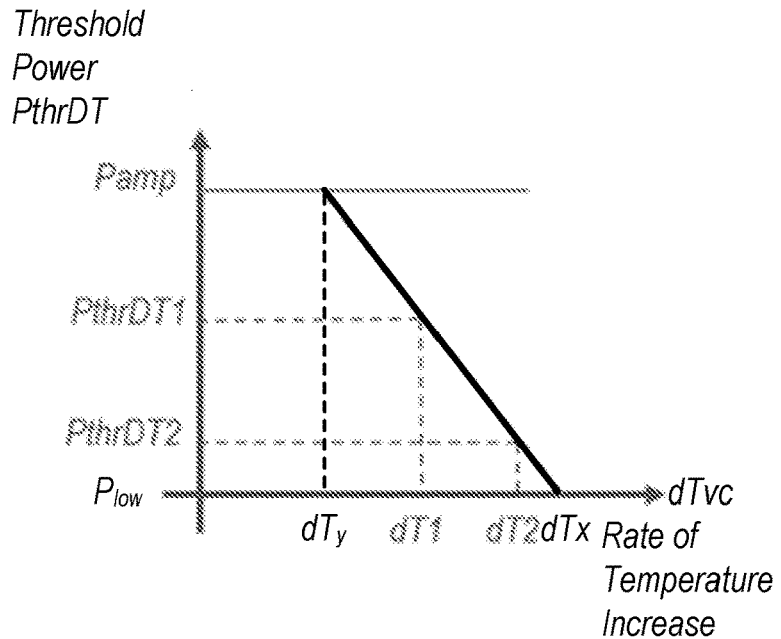
FIGS. 6a and 6b illustrate possible transfer functions between estimated voice coil temperature and rate of change of temperature, and a maximum allowed power.
Figure 6B:
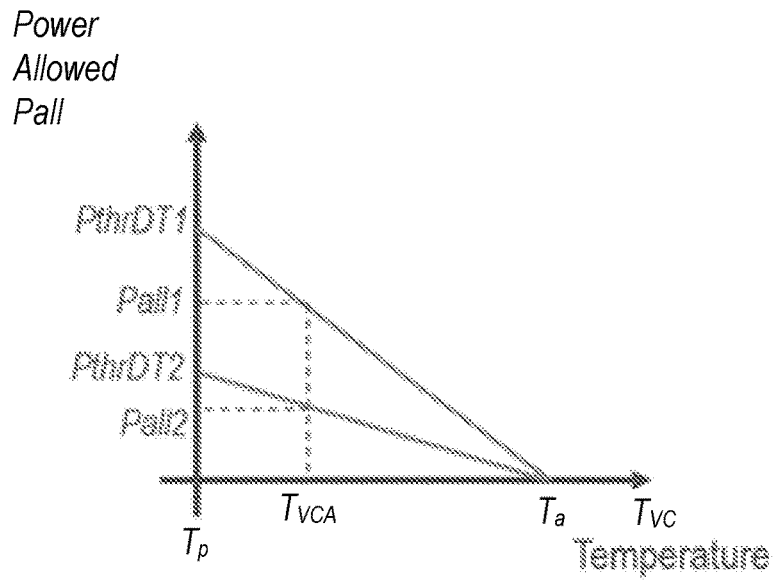

FIGS. 6a and 6b illustrate the operation of the power limit block 502, in one example.

In this example a threshold power value PthrDT is derived as a predetermined function of the rate of temperature increase $DT_{vc}$. This threshold power value is then adjusted according to another predetermined function of the actual voice coil temperature $T_{vc}$ to provide an actual allowed power Pall.

More specifically, the threshold power value PthrDT that is derived as the function of the rate of temperature increase is taken to be the allowed power at a chosen first threshold temperature $T_P$ of the voice coil, with the actual allowed power being lower than the threshold power value PthrDT for temperatures above the first threshold temperature $T_P$.

The first threshold temperature $T_P$ is chosen to be a suitably low temperature. The temperature $T_P$ may for example be 20° C. below the upper limit temperature Tmax.

Specifically, FIG. 6a illustrates a threshold power value PthrDT that will be allowed at threshold temperature $T_P$, as a function of the rate of change of temperature $dT_{vc}$. In this illustrated example, this function is linear, comprising a horizontal segment and a segment comprising a straight line with a negative gradient. Thus, when the rate of change of the temperature is at or below a value of dTy, the threshold power value at the first threshold temperature is set to a maximum power value equal to a value Pamp, which may be the maximum power that the amplifier can drive into the speaker, and which occurs when the temperature is not increasing, or is only slowly increasing. The threshold power value that will be allowed at the threshold temperature has a minimum value $P_{low}$, which occurs when the estimate of the rate of change of the temperature is at a value of dTx or higher. The minimum value $P_{low}$ may have a non-zero value, in order to avoid setting the power allowed to zero and therefore muting the output, but in some embodiments it is set to zero. For any value of the rate of change of the temperature between dTy and dTx, there is a corresponding threshold power value according to the inverse linear dependency illustrated by the segment comprising a straight line with a negative gradient.

For any value of the rate of change of the temperature between zero and dTx, there is thus a corresponding threshold power value corresponding to a maximum power that is thought prudent to be allowed to be dissipated in the voice coil, bearing in mind the current rate of voice coil temperature increase. The value of dTy is set such that, as soon as the rate of temperature increase becomes potentially dangerous, the maximum power allowed at the threshold temperature decreases. For any value of the rate of change of the temperature between dTy and dTx, there is a corresponding maximum power allowed at the threshold temperature. As examples, FIG. 6a shows that, at a rate of change of temperature of dT1, there is a maximum power allowed of PthrDT1, while at a rate of change of temperature of dT2, there is a maximum power allowed of PthrDT2. A higher rate of change of temperature corresponds to a lower maximum power allowed.

FIG. 6a shows a straight-line relationship between the rate of change of temperature and the threshold power value at the first threshold temperature, but any suitable function can be used.

This derived value of the threshold power value is then modified further, in dependence on the actual estimated value of the temperature Tvc, to obtain the actual power allowed value Pall.

FIG. 6b illustrates the actual power allowed, Pall, as a function of the actual temperature. In this illustrated example, this function is a straight line with a negative gradient, between the maximum value, which occurs when the temperature is estimated to be the threshold temperature $T_P$, and a lower limit $P_{low}$, which occurs when the estimate of the temperature is at or above a chosen value of $T_Q$. The temperature $T_Q$ may for example be equal to Tmax, but may be chosen higher or lower. As mentioned above, the minimum value $P_{low}$ may have a non-zero value, in order to avoid setting the power allowed to zero and therefore muting the output, but in some embodiments it is set to zero.

For any value of the temperature between $T_P$ and $T_Q$, there is a corresponding power allowed. As examples, FIG. 6b shows two forms of the function. Thus, FIG. 6b shows a line 550 which indicates the relationship between the temperature and the power allowed at a rate of change of temperature of dT1, and hence a threshold power of PthrDT1. FIG. 6b shows that, at a temperature of $T_{VCA}$, this gives a power allowed of Pall1. FIG. 6b also shows a line 552 which indicates the relationship between the temperature and the power allowed at a rate of change of temperature of dT2, and hence a threshold power of PthrDT2. FIG. 6b shows that, at a temperature of $T_{VCA}$, this gives a power allowed of Pall2.

Thus, for the same actual temperature $T_{VCA}$, a higher rate of change of temperature results in a lower value for the allowed power.

FIG. 6b shows that the allowed power is lower for higher values of the actual temperature.

Figure 7:
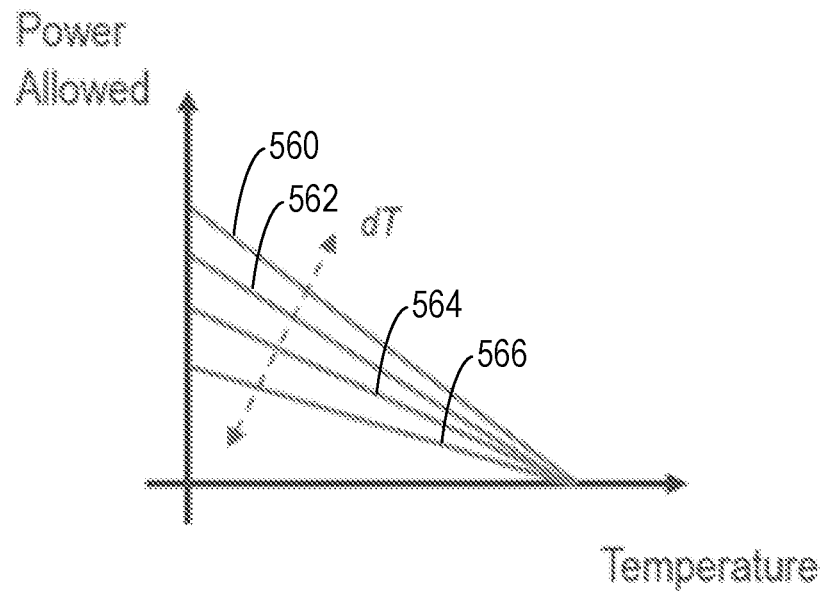
FIG. 7 illustrates further possible transfer functions.

This is also illustrated in FIG. 7, which shows that there are multiple possible relationships between the temperature and the allowed power, as represented by the lines 560, 562, 564, 566, with the selected relationship depending on the calculated value dTvc of the rate of change of the temperature. As described with reference to FIG. 6(a), a higher value of the rate of change of temperature dTvc implies a lower threshold value for the allowed power.

FIGS. 6b and 7 show the relationship between the temperature and the allowed power as being a straight-line relationship. However, any desired relationship can be set, such as a polynomial relationship, or an S-shape relationship.

This is illustrated in FIG. 8, which again shows that there are multiple possible relationships between the temperature and the allowed power, as represented by the lines 570, 572, 574, 576, with the selected relationship depending on the calculated value dTvc of the rate of change of the temperature. As described with reference to FIG. 6a, a higher value of the rate of change of temperature dTvc implies a lower maximum value for the allowed power. However, in this illustrated example, the lines 570, 572, 574, 576 are S-shaped curves, in which a given increase in the temperature leads to a larger reduction in the power allowed for a range of intermediate temperatures than for lower and higher temperatures. That is, at temperatures that are only just above the temperature $T_P$, an increase in temperature produces a relatively small reduction in the power allowed, to try and reduce the heating effect without forcing a strong attenuation of the input signal. However, at temperatures in the region of $T_K$, which may for example be 10° C. above the temperature $T_P$ and 10° C. below the upper limit temperature $T_c$, the same increase in temperature produces a larger reduction in the power allowed.

Thus, the rate limiter described herein enables the gain control to begin even when the temperature is relatively low, for example below any threshold temperature that might otherwise be set. This control is enabled only if the rate of temperature increase is sufficiently large. As mentioned previously, the nature of typical music tracks is such that they do not usually cause fast heating, and so the triggering based on the rate of change will not engage during most music playback. By contrast, signals with high power and narrowband high-frequency content are likely to cause a sufficiently fast temperature rise to trigger the rate limiter, even before the temperature reaches a threshold temperature.

Thus, in the example shown in FIG. 6b, the rate of change of the temperature is used to set the power allowed, at the current temperature, across the range of temperatures from $T_P$ to $T_Q$.

Figure 8:
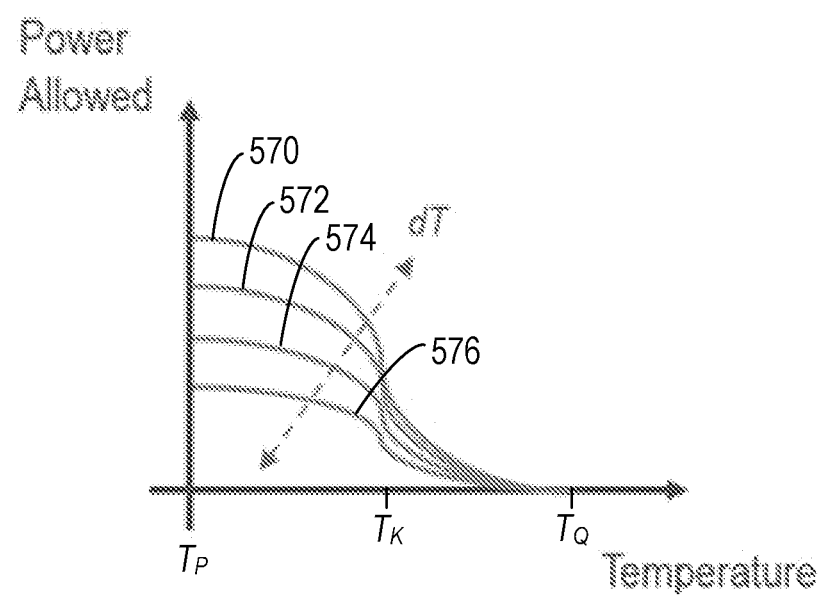
FIG. 8 illustrates further possible transfer functions.

In some embodiments, the setting of the allowed power, as described with reference to FIGS. 6, 7 and 8, can be used when the temperature is below a threshold temperature, while, when the temperature is above the threshold temperature, the allowed power can be set based only on the actual temperature value.

Figure 9:
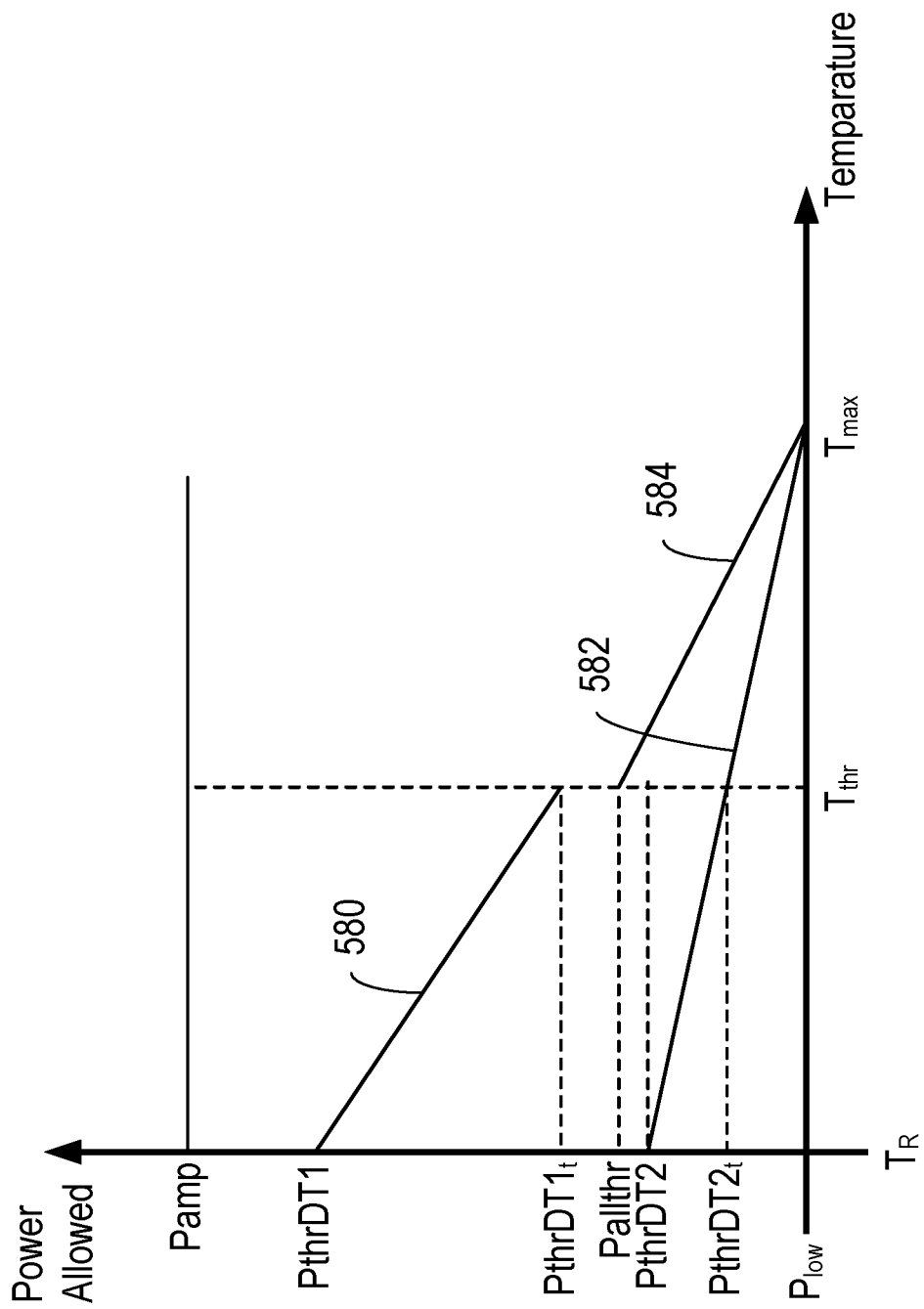
FIG. 9 illustrates an alternative transfer function.

FIG. 9 shows such an alternative relationship, in which the rate of change of the temperature is used in setting the power allowed only at temperatures below a second threshold temperature Tthr, while the rate of change of the temperature is disregarded for temperatures above this second threshold temperature Tthr.

Thus, as examples, FIG. 9 shows two forms of the function, corresponding to respective different rates of change of temperature, for temperatures below the second threshold temperature Tthr. Specifically, FIG. 9 shows a line 580 which indicates the relationship between the temperature and the power allowed at a rate of change of temperature of dT1, between a threshold power allowed of PthrDT1 at the first threshold temperature $T_R$, and a power allowed of PthrDT1$_t$ at the second threshold temperature Tthr. FIG. 9 also shows a line 582 which indicates the relationship between the temperature and the power allowed at a rate of change of temperature of dT2, between a threshold power allowed of PthrDT2 at the first threshold temperature $T_R$, and a power allowed of PthrDT2$_t$ at the second threshold temperature Tthr.

FIG. 9 then also shows the relationship between the power allowed and the temperature, for temperatures above the second threshold temperature Tthr. Specifically, FIG. 9 shows a line 584 which indicates the relationship between the temperature and the power allowed, between a power allowed of Pallthr at the second threshold temperature Tthr and a lower limit $P_{low}$ for the power allowed, which may be above zero as described above or may be set to zero, and which occurs when the estimate of the temperature is at a value of Tmax or higher.

Thus, FIG. 9 illustrates an example, in which the power allowed is a function of the temperature, at temperatures above the second threshold temperature Tthr, and is a function both of the temperature and of the rate of change of temperature, for temperatures below the threshold temperature Tthr.

This simplifies the tuning (that is, the setting of variables such as the threshold temperature, the power allowed curves, the smoothing factors, and the attack and release times) because it makes a distinction between the protection needed to slow down the temperature increase and the protection needed to reduce the temperature level. In addition, different shapes of power allowed curves (such as straight lines, S-shapes, or segments of parabolas or other polynomials) can be chosen independently for the temperature regions above and below the threshold temperature Tthr.

However, FIG. 9 also shows the line 582 extending above the threshold temperature Tthr, between a power allowed of PthrDT2$_t$ at the second threshold temperature Tthr and the lower limit Plow at a temperature of Tmax. This function can be used to set the allowed power, instead of the line 584, for temperatures above the second threshold temperature Tthr. This avoids the possibility that, as the temperature increases at the rate dT2, the allowed power would increase as the temperature reached the second threshold temperature Tthr.

Thus, FIG. 9 also illustrates an example, in which the power allowed is a function of the temperature, at temperatures above the second threshold temperature Tthr, for certain rates of change of temperature, and is a function of the temperature and of the rate of change of temperature, at temperatures above the second threshold temperature Tthr, for certain other rates of change of temperature, while it is a function both of the temperature and of the rate of change of temperature, for temperatures below the second threshold temperature Tthr.

Figure 10:
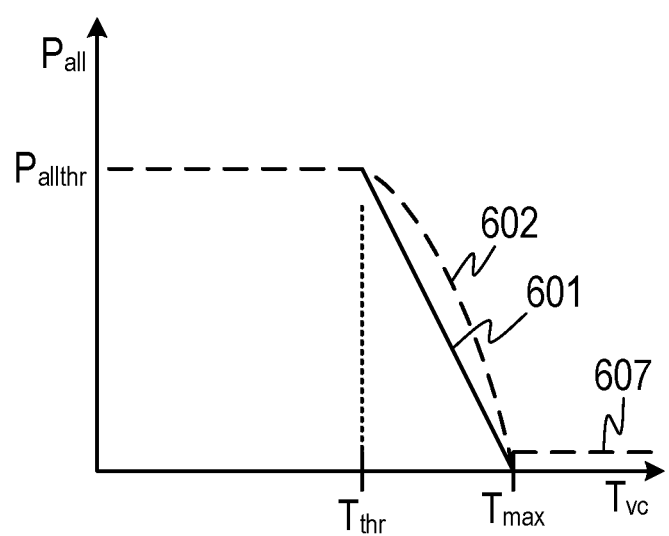
FIG. 10 illustrates various forms of possible transfer functions between estimated voice coil temperature and maximum allowed power.

FIG. 10 illustrates various forms of the transfer function for determining the maximum allowed power dissipation Pall as a function of the temperature, in the region above the second threshold temperature Tthr. One possible form of the function is a linear interpolation between a further threshold value Pallthr (separate and distinct from the threshold power values referred to above) at the threshold temperature Tthr and zero at Tmax as illustrated by solid line 601. Alternatively a more aggressive design might use a function with some convex curvature between these values such as illustrated by curve 602.

In some embodiments, as described above, rather than reduce the maximum allowed power to zero at Tmax, Pall may be set to a small second constant value, less than and possibly significantly less than that which is expected to cause any thermal problems, as indicated by line 607. This will allow the gain subsequently derived to be non-zero avoiding any complete suppression of signal. In some embodiments this may be desirable to ensure some minimum output speaker signal to allow ongoing coil resistance (i.e. temperature) monitoring. This minimum gain may also prevent noise etc. in the temperature measurement from consequently modulating the gain over a range which may be small on a linear scale but noticeable on a log scale and hence give rise to audible artefacts, although it will be appreciated that this could also be handled in the time-domain function, e.g. using some fixed time-out or similar. Maintaining a small but non-zero drive signal D2, as shown in FIG. 3b, may also be useful to avoid unwanted operation of some downstream auto-mute function in the signal processing chain.

One or more of the parameters such as dTx, $T_P$, $T_Q$, Pallthr, Tthr, and Tmax may be fixed in hardware or stored in a suitable non-volatile memory. Suitable values may be set in chip manufacture or in subsequent end-user device manufacturing. In some instances the control circuitry may be associated with the audio drive circuitry but may read one or more parameter values from a memory associated with the loudspeaker. In some embodiments at least some of these parameters may be configurable and may vary during use, for example controlled by a control input (not shown). For example if a temperature-independent value of Pallth is used below the threshold temperature Tth and this value is set at least partly for user ear protection, it may be set to decrease over time as the monitored period of exposure increases.

Figure 11C:
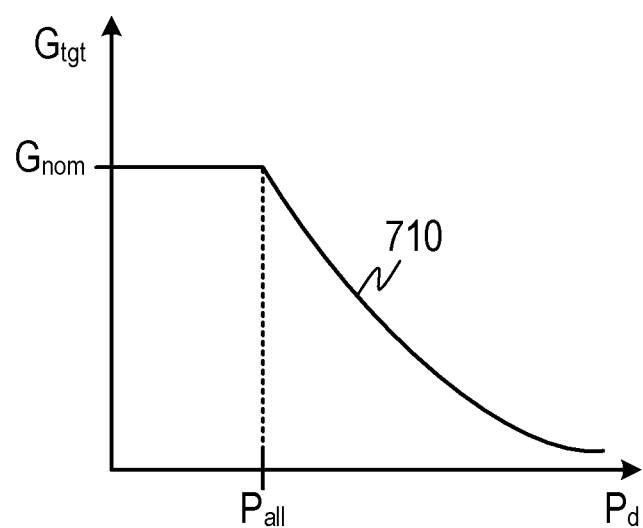

As mentioned the gain calculation block 503 shown in FIG. 5 receives the maximum allowed power level, determined from a relationship as illustrated in FIG. 6b or FIG. 9, or any other suitable relationship between the allowed power and the temperature. Based on this received allowed power level, the gain calculation block 503 determines the target gain based on the current power dissipation. A second transfer function $f_G(Pd, Pall)$ for determining the target gain may take various forms as illustrated in FIGS. 11a, 11b, and 11c. FIGS. 11a, 11b and 11c illustrate how the target gain value may be adjusted in accordance with the estimated power dissipation Pd for different values of the maximum allowed power Pall.

FIGS. 11a, 11b and 11c illustrate that $G_{tgt}$ may be set to reduce from some nominal value $G_{nom}$ with increasing values of Pd. The nominal gain value may be defined consistently with the gain of other elements of the system to provide the required gain between output power of the drive signal and the input audio signal, e.g. the digital input signal $D_{in}$. The nominal gain value can be regarded as unity if other gains in the signal processing chain are defined appropriately.

FIG. 11a illustrates that the target gain $G_{tgt}$ may be defined as a linear interpolation from $G_{nom}$ at zero power to zero at Pall, i.e. $G_{tgt}=G_{nom} \cdot (1-P_d/P_{all})$. Line 701 illustrates this interpolation for a first value of $P_{all}$, i.e. $P_{all}(T_1)$, at a first voice coil temperature $T_1$. If the temperature of the voice coil increases over time, to say $T_2$ then $P_{all}$ will decrease to $P_{all}(T_2)$. This will lead to a steeper gradient in the decrease from $G_{nom}$ to zero as illustrated by curve 702.

It will be noted that as the temperature of the voice coil $T_{vc}$ approaches the maximum allowed temperature $T_{max}$, and thus $P_{all}$ approaches zero, the slope of the gain curve thus increases, in theory to infinity if $T_{vc}$ actually reaches $T_{max}$ and $P_{all}$ were reduced to zero. A very steep gradient for the gain curve may give audible artefacts as the input signal power varies. To reduce the maximum gain slope on a dB scale for low gains the minimum value of $P_{all}$ may be limited to a non-zero value as described above.

Instead of a linear interpolation between $G_{nom}$ and zero (for a given value of $P_{all}$) a more aggressive curve with convex curvature may be employed to allow more power at intermediate temperatures, as illustrated by curve 703. For example a transfer function of the form $G=G_{nom} \cdot sqrt(1-P_d/P_{all})$ could be used to give a linear interpolation of power gain rather than voltage gain.

Rather than setting the target gain to zero when $P_d$ is equal to (or greater than) $P_{all}$, the target gain $G_{tgt}$ may be set to a small value, less or much less than that which is expected to cause any significant temperature overshoot, as illustrated by line 704. This may be preferred to complete attenuation of the drive signal for the same reasons as described above (with respect to setting $P_{all}$ to be a small non-zero value rather than zero).

To avoid any gain modulation while only small signals are applied to a voice coil, the target gain $G_{tgt}$ may be defined to be constant, e.g. equal to the nominal gain value $G_{nom}$, up to some threshold output power $P_{th}$ as illustrated in FIG. 11b. When the power dissipation threshold is reached it may then be subject to some linear interpolation 705 or non-linear interpolation 706 with a gradient based on the value of $P_{all}$, similar to that described with respect to FIG. 11a. For example when $P_d$ is greater than $P_{th}$ the target gain may be equal to $(1-(P_d-P_{th})/(P_{allthr}-P_{th}))$, possibly again being reduced to zero or some small level 704.

FIG. 11c illustrates a further possible relationship between the power dissipation $P_d$ and the target gain $G_{tgt}$. Specifically, the line 710 in FIG. 11c illustrates the relationship $G_{tgt}=G_{nom} \cdot Sqrt(P_{all}/P_d)$, where the dissipated power is greater than the allowed power (i.e. $P_d > P_{all}$), and $G_{tgt}=G_{nom}$ where the dissipated power is less than the allowed power (i.e. $P_d < P_{all}$).

It will be appreciated that changes in the power dissipated can occur over relatively quick timescales and can occur faster than the time constant of temperature change of the voice coil or magnet. Thus for rapid changes of the dissipated power the value of $P_{all}$ may be substantially unchanging and thus the relationship between the target gain and the dissipated power will be substantially fixed. Over a longer timescale however the voice coil temperature may change and thus the particular gain vs. power profile may also vary. This could lead to a change in gain being applied some time after the input signal level has stabilised.

It will be appreciated that the discussion with reference to FIGS. 11a, 11b and 11c has focussed on generating a gain control value which is a target gain setting for thermal protection, i.e. a value corresponding to the gain to be applied. Thus the target gain drops with increasing values of power dissipation $P_d$. Equivalently however the gain control value could be a gain modulation value, indicating the magnitude of the modulation to the nominal gain setting, which would increase with power dissipation.

It can therefore be seen that in general the speaker protection module of embodiments of the present invention generates a control signal for modulating the gain applied to an input audio signal used to drive a loudspeaker based on a measure of the present voice coil temperature of the loudspeaker and an indication of the power dissipation in the loudspeaker. The gain applied may vary in accordance with changes in the power dissipated in the loudspeaker (at least with a range of expected operating temperature) and the amount of change of gain resulting from a given change in power dissipation depends on the voice coil temperature (via the $P_{all}$ dependence).

It should be noted that gain factors described above are defined as voltage gain factors, suitable for applying to the signal as a simple multiplication, rather than power gain (i.e. the square of a voltage or digital signal gain) even though defined with respect to a power variable. In some embodiments the gain control signal may be generated as a non-linear gain value, for example representing the required gain in decibels or such like coupled to a gain control stage 305 configured suitably.

In some embodiments the gain control for thermal protection may be combined with a gain control applied for user volume control. Thus gain element 305, e.g. a digital multiplier, may be arranged to apply a gain modulation to the input signal that applies any user volume controller gain along with any gain modulation for thermal protection (and/or any other required gain modulation such as for excursion limiting or ear protection). The gain controller 304 may therefore also receive an additional gain control signal, such as a user volume control signal. In some embodiments the nominal gain value $G_{nom}$ may be modulated by such a user volume control signal to become a new value $G_{adj}$. This may scale the whole characteristic vertically such that the gain is maintained at $G_{adj}$ until the threshold $P_{th}$ is reached and then reduced down to zero (or to the defined small non-zero level) at some threshold value $P_{allthr}$, as illustrated by segment 707. Preferably however the gain may be maintained equal to $G_{adj}$ until it intercepts the previous nominal interpolation function, e.g. 705, thus avoiding the need for any signal attenuation until higher power levels.

As mentioned above a gain control block 504 may apply some time-domain processing on the target gain signal to improve the implementation of the required gain change. It will be appreciated that a change in gain could in some instance lead to an audible artefact in the audio and the time-domain processing may aim to reduce or eliminate such artefacts.

Such time domain processing may include zero-crossing detection of the input signal $D_{in}$. For instance gain changes may only be applied when the input signal crosses zero to avoid steps introduced by gain changes applied to a non-zero part of the signal.

The time domain processing may additionally or alternatively comprise applying decay time constants to limit the rate of change of any gain reductions applied to the signal so as to reduce any audible artefacts. Such decay time constants may be longer than audio signal time constants but shorter than any thermal time constants.

The time domain processing may additionally or alternatively comprise applying attack time constants to limit the rate of change of any gain increases applied to the signal, e.g. as the voice coil cools down following a reduction in the amplitude of the drive signal (possibly due to a reduced input signal and/or a reduction in gain being applied). Such attack time constants may be longer than audio signal time constants. They may be longer than at least one of the thermal time constants. This may reduce possible thermal oscillations and consequent unnecessary or avoidable gain modulations.

Additionally or alternatively the gain control block 504 may be arranged to apply time-outs or minimum intervals between gain updates, to limit the maximum frequency of gain changes and hence any audio artefacts.

As mentioned above if there is no or little output power it may be difficult to obtain an accurate estimate of coil temperature, in which case a time-out may be imposed before the gain is recovered enough to obtain a revised temperature estimate.

As mentioned above, the various parameters of the power limit block 502 may be fixed in hardware or stored in memory and/or may be configurable in use. Likewise the parameters of the gain calculation block 503 and gain control block 504 may similarly be fixed in hardware or non-volatile memory and may be set in chip or end-user device manufacturing. One or more parameters may vary during use, e.g. controlled by a further control input. The calculation of functions $f_P$, $f_G$ may be implemented via look-up tables or by customised or programmable processing hardware implementing the desired algebraic formulae.

It will be appreciated by one skilled in the art that the loudspeaker protection control module 306 may be implemented by dedicated electronic circuit components and/or by various processing elements such as a general purpose programmable digital processor or FPGA array or the like suitably programmed. For example the power and temperature extraction block 303 and/or the controller 304 may be implemented, at least partly, as software modules running on a suitable processor. The term modules and block should therefore be read as covering both software modules or hardware modules or a mixture of both software and hardware. Any references to circuitry for these components could also mean suitable general processing circuitry.

As illustrated in FIGS. 10, 11a, 11b, various possible shapes of $P_{all}$ vs $T_{vc}$ and $G_{tgt}$ vs $P_d$ characteristic are possible, and there is also freedom in choosing values for $T_{thr}$, $P_{allthr}$ and $P_{th}$. Generally, steeper or more convex curves will allow more power to be maintained for longer, but once the limit is reached, the modulation of the gain has to be more rapid to avoid overshooting $T_{max}$. In the limit, the action would become a sudden turn-off, similar to an amplifier thermal shutdown, which is undesirable. In some embodiments (for instance, ones similar to the one described above) $P_{allthr}$ may be defined as that power, if maintained, to raise the coil temperature from some $Tt_{th}$ to $T_{max}$ in a few seconds, of the order of a voice coil time constant. This will lead to worst case gain changes in use spanning over time spans of this order. However, even if $P_{allthr}$ were chosen much higher (or the thermal characteristics of one individual loudspeaker were much more resistive than typical) since $P_a$ and hence $G_{tgt}$ are controlled to be at least near zero at $T=T_{max}$, the system would still be controlled to ensure that $T_{vc}$ never exceeds $T_{max}$, so in some sense the system design will "fail safe" even if non-optimum parameters (except for $T_{max}$) are applied.

Since an indication of the actual temperature is used, including for calculating the rate of change of the temperature, rather than some modelled value based on drive voltage and some thermal model, and since a signal representing the actual voice coil power dissipation is used based on measured drive voltage and coil current rather than relying on a measure of the input signal voltage and some assumed speaker impedance, embodiments of the invention can be designed with less margin for tolerances in the system. Thus, for example, the signal level up to which the gain is unchanged may be greater compared to a conventional design, and embodiments of the invention may behave better in extreme conditions, for example excessive ambient temperature.

Figure 12A:
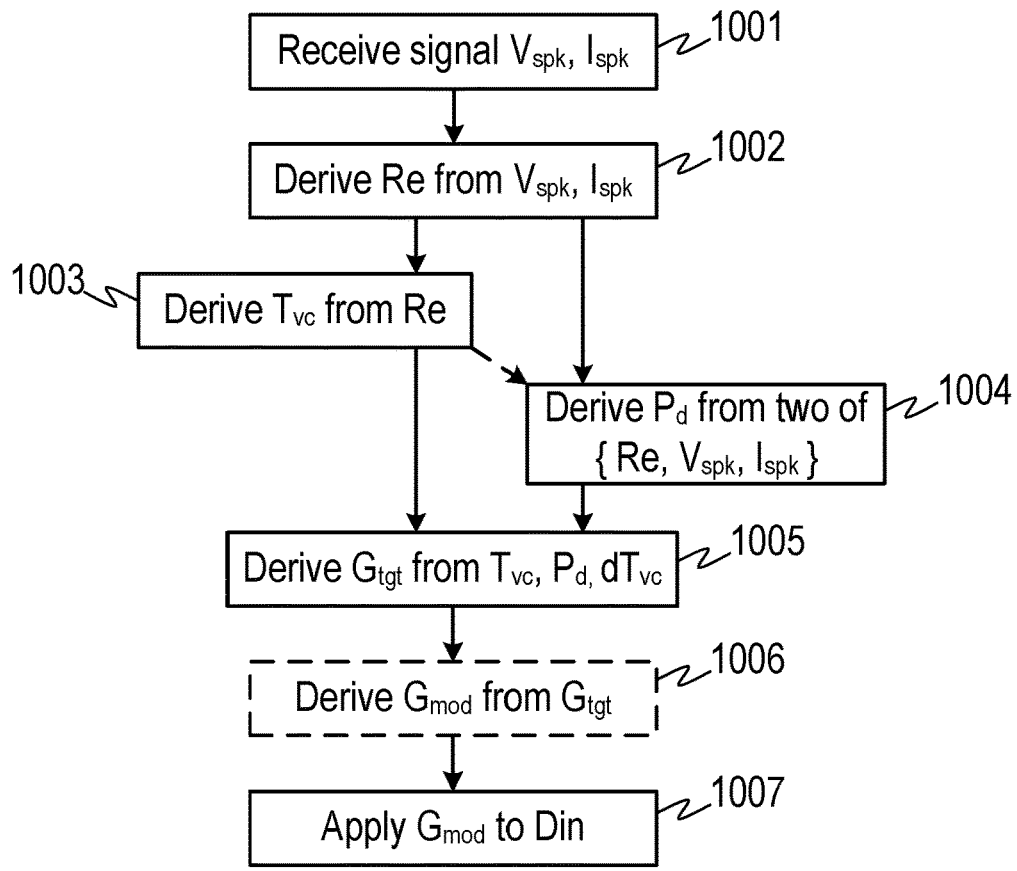
FIGS. 12a and 12b illustrate flowcharts of methods of embodiments of the invention.

FIG. 12a shows a flow diagram illustrating the general method implemented by some embodiments of the invention such as described above. At step 1001 a loudspeaker protection control module receives signals $V_{spk}$ and $I_{spk}$ indicative of the monitored voice coil drive voltage $V_{spka}$ and voice coil current $I_{spka}$. The loudspeaker protection control module 306, at step 1002, derives an indication or estimate of the resistance voice coil resistance Re. At step 1003 an estimate $T_{vc}$ of the voice coil temperature is derived from the estimated voice coil resistance Re. At step 1004 an estimate $P_d$ of the present power dissipation of the loudspeaker, is derived from the indicative voltage and current signals $V_{spk}$ and $I_{spk}$ (or optionally from at least one of these signals and also the estimated voice coil resistance Re). A target gain control value may then be derived (step 1005) based on the voice coil power dissipation estimate $P_d$, the voice coil temperature estimate $T_{vc}$ and the estimate of the rate of change of the voice coil temperature $dT_{vc}$. This target gain control value may be used directly as a gain control signal or optionally, at step 1006 additional processing may derive a gain control signal $G_{mod}$. The gain control signal may then be applied to the input signal (step 1007).

Figure 12B:
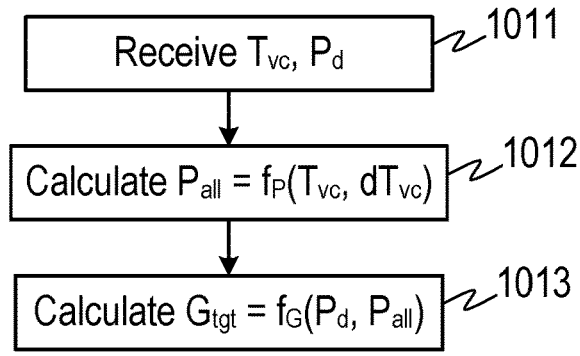

FIG. 12b shows a flow chart illustrating some of the processing that may be applied in calculating the target gain. At step 1011 the voice coil power dissipation estimate $P_d$ and the voice coil temperature estimate $T_{vc}$ are received. At step 1012, an estimate of the rate of change of the temperature $dT_{vc}$ is formed from the temperature estimates, and an allowed maximum power $P_{all}$ is derived based on a defined function $fp(T_{vc}, dT_{vc})$. The allowed power $P_{all}$ is then used together with the voice coil power dissipation estimate $P_d$ to derive a target gain $G_{tgt}$.

Figure 13:
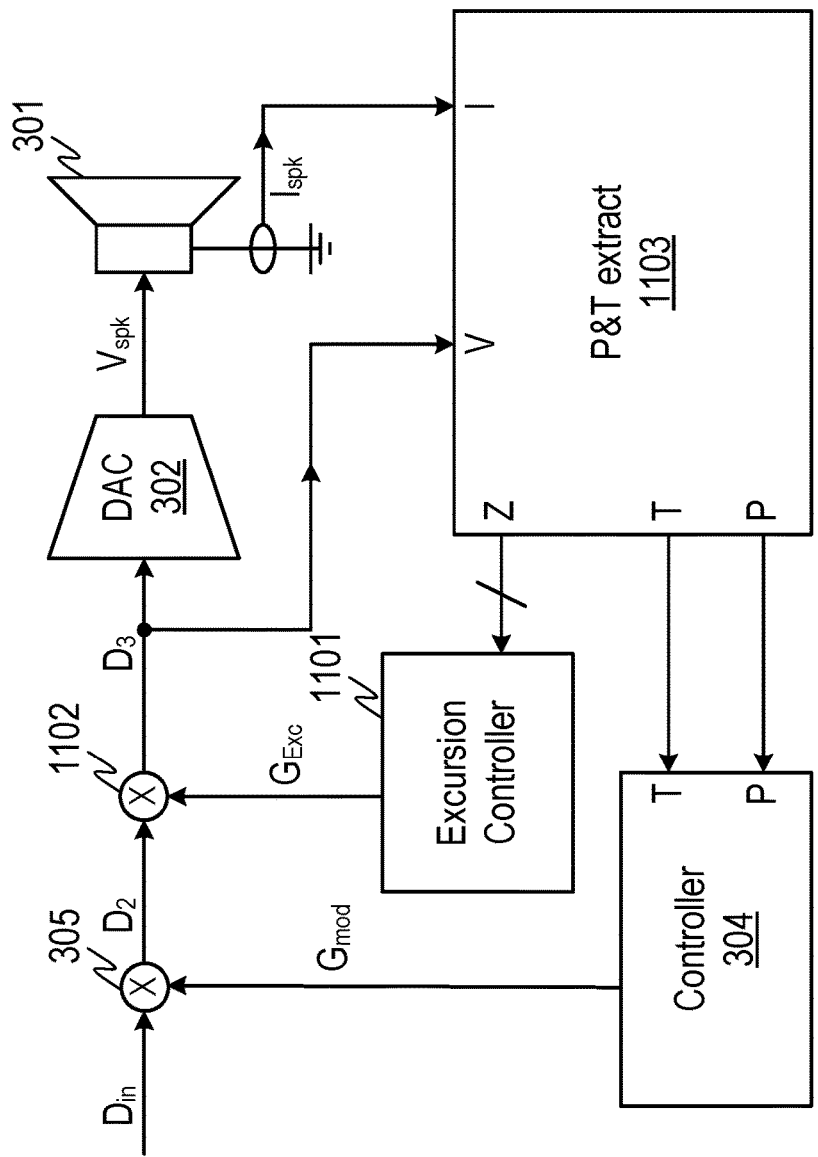
FIG. 13 illustrates a further embodiment of the invention.

As mentioned above in some applications it may be desirable to determine an indication of the loudspeaker voice coil resistance for other reasons, for example for limiting the excursion of the loudspeaker. Thus an impedance extraction block 402 such as that described with respect to FIG. 4 may be shared with other elements of speaker protection circuitry. FIG. 13 illustrates an embodiment of the invention where similar components to those described above are identified using the same reference numerals but where the protection module 306 also comprises an excursion controller 1101 for controlling an additional gain element 1102 in the forward signal path.

A power and temperature extraction block 1103 receives an indication of the voice coil current and the drive signal voltage (conveniently receiving the digital input signal input to the DAC output stage 302) as described previously. This block will determine, i.e. calculate, an estimate of the coil resistance as described above and determined power, temperature, and rate of change of temperature estimates. The power, temperature, and rate of change of temperature estimates are provided to thermal protection controller 304 to generate a gain modulation signal $G_{mod}$ as described previously. In this embodiment however an impedance extraction block of the power and temperature extraction block 1103 also extracts other impedance parameters of the voice coil for use in excursion limiting circuitry. It will be appreciated that coil impedance varies depending on temperature and on its position with respect to the magnet etc.

Excursion controller therefore receives an indication of the coil impedance and determines an appropriate gain $G_{Exc}$ to be applied to the audio signal by gain element 1102 to limit the excursion of the loudspeaker to within safe bounds.

It would of course be possible to integrate excursion controller 1102 and thermal protection controller 304 in a single functional block and in some embodiments a single gain control signal may be produced and used to control a single gain element.

Embodiments have been described above in relation to a protection module for one output speaker. Other embodiments may comprise a protection module for a plurality of output speakers, which may all receive the same input signal or in some embodiment there may be a plurality of different input signals. The protection module may be configured to treat each input signal as an independent channel, or gains may be ganged, so that all gains are reduced together, based on the worst case channel. Since actual output powers and coil temperatures are used, there is no need to assume ultra-safe values for thermal time constants etc. so less margin is needed, and each speaker can drive closer to its safe operating limits. For example if one speaker has poor thermal resistance, it would only be necessary to limit the input signals if that particular speaker is receiving a large signal.

Embodiments of the invention therefore relate to speaker protection circuitry for thermal protection of a loudspeaker, in particular to limit the voice coil temperature within safe limits by modulating the gain of the drive signal when required. In embodiments the circuitry calculates, i.e. determines, both an estimate of the power being dissipated in the loudspeaker and the present voice coil temperature to determine an acceptable power limit and reduces the gain of the drive signal based on the relative level of present power dissipation and the acceptable power limit.

Figure 14:
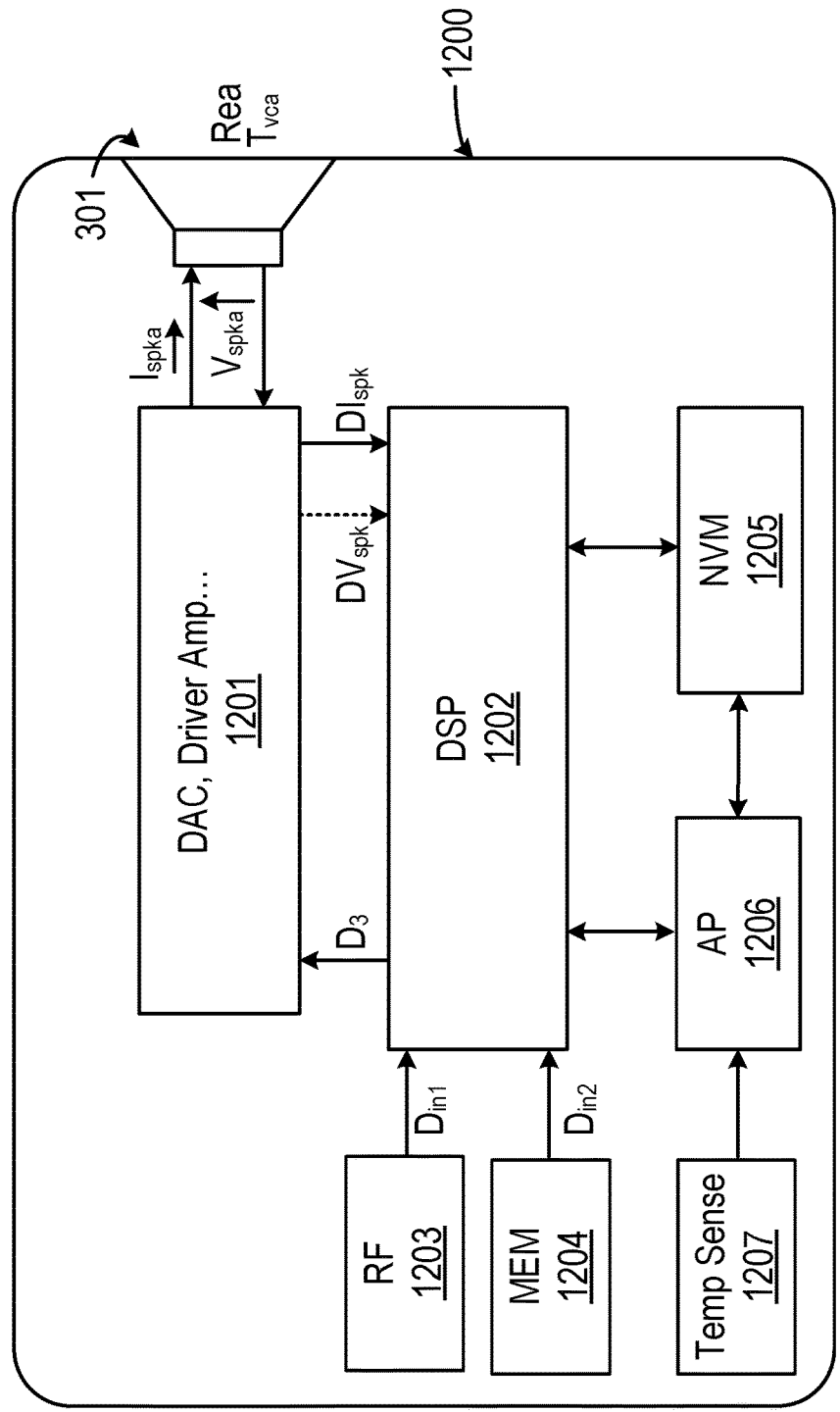
FIG. 14 illustrates an electronic device having a speaker protection module according to an embodiment of the invention.
Figure 9:
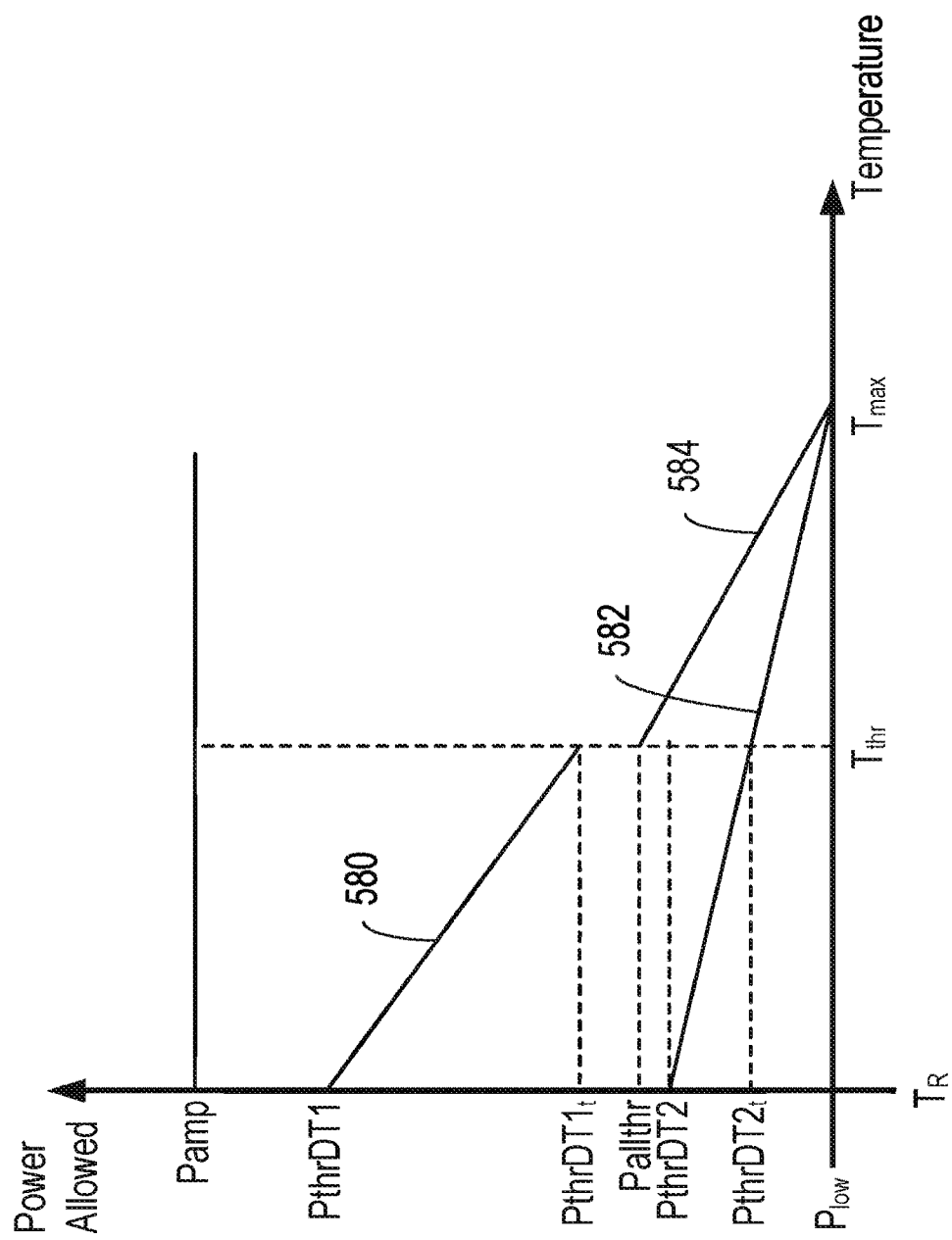
Figure 12A:
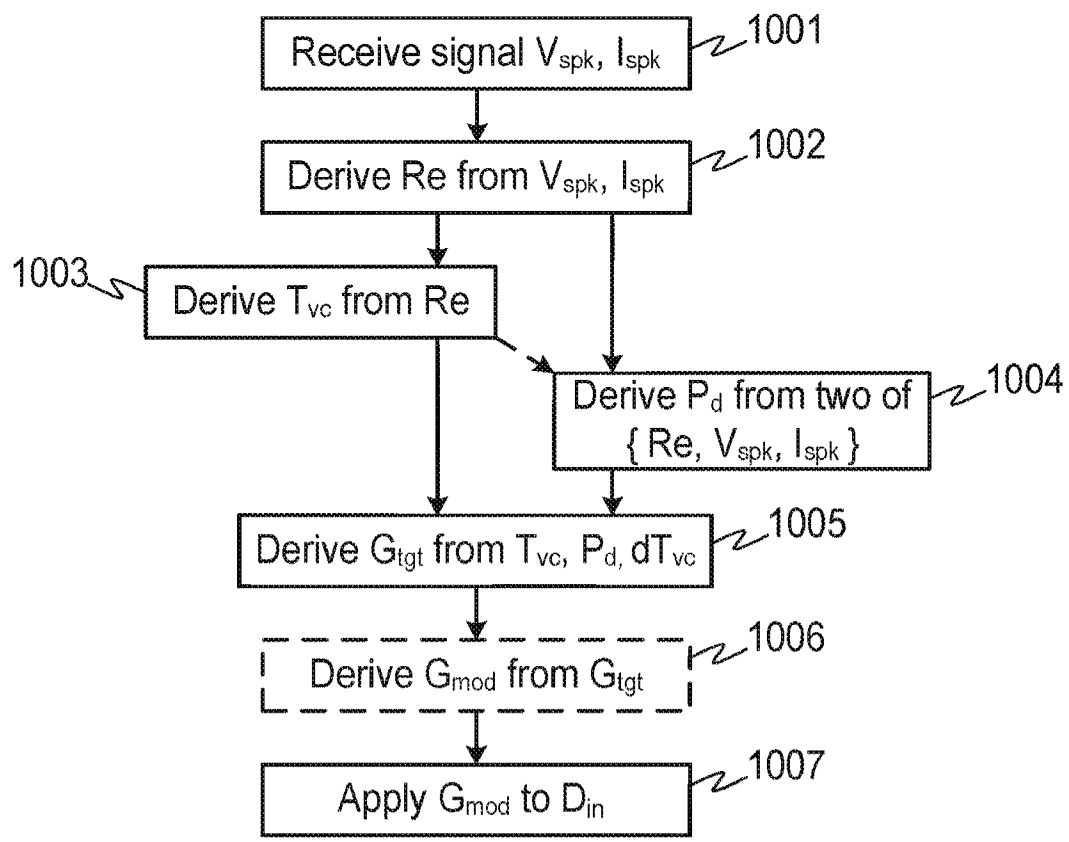
Figure 12B:
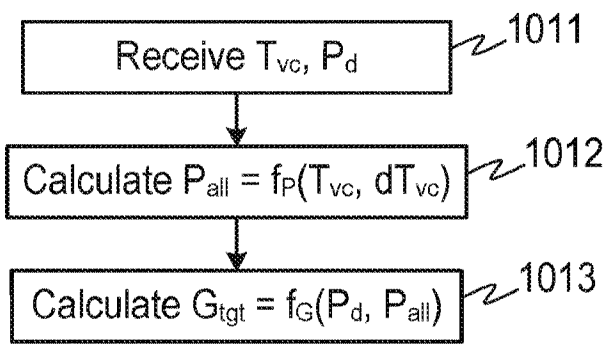

Such speaker protection circuitry may be implemented in an electronic apparatus or device, which may be at least one of: a portable device; a battery power device; a computing device; a communications device; a gaming device; a mobile telephone; a personal media player; a laptop, tablet or notebook computing device. FIG. 14 shows an example where a device 1200 is, for example a mobile phone. This device 1200 comprises a loudspeaker 301 which is driven from a driver circuit block 1201, which forms at least part of the signal processing chain 300. The driver circuit block 1201 receives a digital audio signal D3 and delivers a resultant voltage $V_{spka}$ across the speaker.

This driver circuit block 1201 may comprise a DAC (possibly oversampled e.g. delta-sigma) and analogue amplifier powerful enough to drive the impedance of the speaker. Alternatively it may comprise a Class D amplifier, either half-bridge or full-bridge, with an analogue input from a DAC, or possibly an all-digital Class D modulator. The driver signal processing chain may also possibly include analogue signal processing.

The speaker current $I_{spka}$ is monitored to provide a signal representative of this current. An analogue current sense signal may be generated by a sense resistor which may be local to the speaker (possibly buffered locally) or co-located with the amplifier. The amplifier may be inside the speaker package or may be a more remote power amplifier, either discrete or embedded in a more complex codec. As an alternative to a sense resistor the voltage across a MOS output transistor may be sensed to measure the current. Whilst an analogue signal for the speaker current could be provided, in some embodiments it may be preferred to provide a digital signal $DI_{spk}$ indicative of the sensed current. The sense buffer/digitising circuitry may therefore be provided as part of the local speaker driver chip 1201. Note that where a sense resistor or the like is used for current monitoring there may be a need for some room-temperature electrical calibration of the temperature-sense resistor. Such calibration would however be rapid, of the order of milliseconds and such calibration does not require the long time constants associated with trying to determine thermal resistance from temperature versus power measurements.

The digital speaker current signal $DI_{spk}$ is provided along with a digital signal $DV_{spk}$ representative of $V_{spka}$. Where the driver circuit 1201 includes analogue processing the driver circuit may include an ADC to deliver the signal $DV_{spk}$, but in many cases $D_3$ will already be an adequate indicative signal.

A digital signal processing (DSP) 1202 block implements the speaker protection control module. The DSP block 1202 may receive a digital input audio signal $D_{in}$ intended for the speaker 301. This could for example be an audio signal $D_{in1}$ received from an interface 1203, for instance an RF radio/wireless interface or modem which could for example be received audio for a voice/video call and/or streaming media. At other times the input could be an audio signal $D_{in2}$ which may be received from some data storage 1204, for instance disk storage, either mechanical or solid-state, or some other semiconductor memory. This storage may be a permanent part of device 1200 or may be attachable storage such as a memory card or USB stick or suchlike. The DSP 1202 includes a gain stage to apply gain to the input signal Din and also possibly further DSP or multiplier blocks to perform further signal processing to generate the digital signal D3 supplied to the driver block 1201.

The speaker protection control module may be implemented by software code running on the DSP 1202.

This software code may be stored in the device as firmware on some non-volatile memory e.g. EEPROM (to preserve program data when the battery becomes discharged or is removed for replacement.

The relevant software for running the loudspeaker protection module may be loaded into the DSP on power-up, which could be for example awaking of the device 1200 from a standby mode, or on start-up of the speaker driver function, e.g. on receipt of user command to start outputting sound via the loudspeaker.

A separate processor, for example an applications processor, AP, or processor core 1206 may control this start-up.

In some applications at least some audio data (e.g. ring tone, pre-recorded voice alert or the like) may be provided from the NVM 1205, either directly or via processor AP 1206.

As mentioned previously in some embodiments the speaker protection control module may determine the resistance of the voice coil based on a reference voice coil resistance which could be determined on device start-up. In such embodiments the ambient temperature may be sensed by a temperature sensor 1207 in order to infer the voice coil temperature on start-up. In some devices a temperature sensor may be present for other reasons anyway and may be used for this purpose, for example providing ambient temperature data to the applications processor 1206 as illustrated. In other embodiments however the ambient temperature data could be provided directly to the DSP 1202. Such an ambient temperature sensor may additionally or alternatively be used in calibrating any sense resistor provided for monitoring the current of the voice coil.

It will of course be appreciated that the various blocks illustrated in FIG. 11 or parts thereof may be co-integrated with the other blocks or parts thereof or with other functions of the host device. For example the DSP 1202 and driver block 1201 may be co-integrated into an Audio Hub.

The skilled person will thus recognise that some aspects of the above-described apparatus and methods, for example the calculations performed by the processor may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Embodiments of the invention may be arranged as part of an audio processing circuit, for instance an audio circuit which may be provided in a host device. A circuit according to an embodiment of the present invention may be implemented as an integrated circuit. One or more loudspeakers may be connected to the integrated circuit in use.

Embodiments may be implemented in a host device, especially a portable and/or battery powered host device such as a mobile telephone, an audio player, a video player, a PDA, a mobile computing platform such as a laptop computer or tablet and/or a games device for example. Embodiments of the invention may also be implemented wholly or partially in accessories attachable to a host device, for example in active speakers or headsets or the like.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

The invention claimed is:

1. A method of thermal protection of a voice coil of a loudspeaker comprising:
   determining an estimate of a temperature of the voice coil,
   determining an estimate of a rate of change of the temperature of the voice coil,
   determining an estimate of power dissipation in the voice coil, and
   generating a gain control signal for modulating a gain applied to an input signal in a signal path between an input terminal and said loudspeaker,
   wherein the gain control signal is generated by:
      based on the estimate of the rate of change of the temperature of the voice coil, setting a threshold power value,
      based on the threshold power value and on the estimate of the temperature of the voice coil, setting an allowed power value, and
      based on the allowed power value and the estimate of power dissipation in the voice coil, generating the gain control signal for modulating the gain applied to the input signal in the signal path between the input terminal and said loudspeaker.

2. A method according to claim 1, comprising, when the estimate of the rate of change of the temperature of the voice coil is below a threshold value, setting the threshold power value to be a predetermined maximum power value to be applied to said loudspeaker.

3. A method according to claim 1, comprising:
   setting the allowed power value as a result of a predetermined relationship between the threshold power value and the estimate of the temperature of the voice coil.

4. A method according to claim 3, wherein the predetermined relationship between the threshold power value and the estimate of the temperature of the voice coil is an inverse linear relationship.

5. A method as claimed in claim 1, wherein said estimate of voice coil temperature is based on:
   the difference between the value of said estimated voice coil resistance and a reference resistance value at a known temperature; and
   a temperature coefficient for the loudspeaker voice coil.

6. A method as claimed in claim 5 wherein at least one of said temperature coefficient and said reference resistance value is determined in a calibration step.

7. A method as claimed in claim 1, comprising determining a succession of estimates of the temperature of the voice coil, and determining a succession of estimates of the rate of change of the temperature of the voice coil, wherein each estimate of the rate of change of the temperature of the voice coil is obtained from two successive estimates of the temperature of the voice coil.

8. A method as claimed in claim 1, wherein said estimate of power dissipation is based on said estimated voice coil resistance and said monitored current.

9. A method as claimed in claim 8 wherein said estimate of power dissipation is determined by multiplying said estimated voice coil resistance by the square of the value of said monitored current.

10. A method as claimed in claim 1, comprising applying a first transfer function to said estimate of voice coil temperature to determine an allowed power limit, wherein the value of said gain control signal is a function of said allowed power limit.

11. An electronic apparatus comprising a processor, and memory containing suitable software code for performing the method of claim 1.

12. An electronic apparatus as claimed in claim 11 wherein said apparatus is at least one of: a portable device; a battery power device; a computing device; a communications device; a gaming device; a mobile telephone; a personal media player; a laptop, tablet or notebook computing device.

13. A method of thermal protection of a voice coil of a loudspeaker comprising:
determining an estimate of a temperature of the voice coil,
determining an estimate of a rate of change of the temperature of the voice coil,
determining an estimate of power dissipation in the voice coil, and
generating a gain control signal for modulating a gain applied to an input signal in a signal path between an input terminal and said loudspeaker,
wherein,
when the estimate of the temperature is below a threshold temperature, the gain control signal is generated by:
based on the estimate of the rate of change of the temperature of the voice coil, setting a threshold power value,
based on the threshold power value and on the estimate of the temperature of the voice coil, setting an allowed power value, and
based on the allowed power value and the estimate of power dissipation in the voice coil, generating the gain control signal for modulating the gain applied to the input signal in the signal path between the input terminal and said loudspeaker; and,
when the estimate of the temperature is above a threshold temperature, the gain control signal is generated by:
based on a separate threshold power value and on the estimate of the temperature of the voice coil, setting an allowed power value, and
based on the allowed power value and the estimate of power dissipation in the voice coil, generating the gain control signal for modulating the gain applied to the input signal in the signal path between the input terminal and said loudspeaker.

14. A method of thermal protection of a voice coil of a loudspeaker comprising:
determining an estimate of a temperature of the voice coil,
determining an estimate of a rate of change of the temperature of the voice coil,
determining an estimate of power dissipation in the voice coil, and
generating a gain control signal for modulating a gain applied to an input signal in a signal path between an input terminal and said loudspeaker,
wherein, (a) when the estimate of the temperature is below a threshold temperature, the gain control signal is generated by:
based on the estimate of the rate of change of the temperature of the voice coil, setting a threshold power value,
based on the threshold power value and on the estimate of the temperature of the voice coil, setting an allowed power value, and
based on the allowed power value and the estimate of power dissipation in the voice coil, generating the gain control signal for modulating the gain applied to the input signal in the signal path between the input terminal and said loudspeaker;

(b) when the estimate of the temperature is above a threshold temperature and the estimate of the rate of change of the temperature of the voice coil is above a rate threshold, the gain control signal is generated by:
based on the estimate of the rate of change of the temperature of the voice coil, setting a threshold power value,
based on the threshold power value and on the estimate of the temperature of the voice coil, setting an allowed power value, and
based on the allowed power value and the estimate of power dissipation in the voice coil, generating the gain control signal for modulating the gain applied to the input signal in the signal path between the input terminal and said loudspeaker; and (c) when the estimate of the temperature is above a threshold temperature and the estimate of the rate of change of the temperature of the voice coil is below a rate threshold, the gain control signal is generated by:
based on an alternative threshold power value and on the estimate of the temperature of the voice coil, setting an allowed power value, and
based on the allowed power value and the estimate of power dissipation in the voice coil, generating the gain control signal for modulating the gain applied to the input signal in the signal path between the input terminal and said loudspeaker.

15. A method according to claim 14, comprising:
setting the allowed power value as a result of a predetermined relationship between the threshold power value or the alternative threshold power value and the estimate of the temperature of the voice coil.

16. A method according to claim 15, wherein the predetermined relationship between the threshold power value or the alternative threshold power value and the estimate of the temperature of the voice coil is an inverse linear relationship.

17. A method according to claim 15, wherein the predetermined relationship between the threshold power value or the alternative threshold power value and the estimate of the temperature of the voice coil is an inverse S-shaped relationship in which a given increase in the temperature leads to a larger reduction in the allowed power value in a range of intermediate temperatures than at temperatures below and above said range.

18. A method of thermal protection of a voice coil of a loudspeaker comprising:
determining an estimate of a temperature of the voice coil,
determining an estimate of a rate of change of the temperature of the voice coil, by comparing two successive estimates of the temperature of the voice coil to obtain a difference value, and applying smoothing to the difference value, determining an estimate of power dissipation in the voice coil, and
generating a gain control signal for modulating a gain applied to an input signal in a signal path between an input terminal and said loudspeaker,
wherein the gain control signal is generated by:
as a function of all of said estimate of the temperature of the voice coil, said estimate of the rate of change of the temperature of the voice coil, and said estimate of the power dissipation in the voice coil.

19. A non-transitory storage medium having stored thereon software code which, when run on a suitable processor, performs the method of claim 18.

20. An electronic device comprising memory containing software code and a suitable processor for performing the method of claim 18.

21. A method as claimed in claim 18, comprising applying a first transfer function to said estimate of voice coil temperature to determine an allowed power limit, wherein the value of said gain control signal is a function of said allowed power limit.

22. A non-transitory storage medium having stored thereon one or more instructions which, when run on a suitable processor, causes the processor to:
determining an estimate of a temperature of a voice coil of a loudspeaker,
determining an estimate of a rate of change of the temperature of the voice coil,
determining an estimate of power dissipation in the voice coil, and
generating a gain control signal for modulating a gain applied to an input signal in a signal path between an input terminal and said loudspeaker,
wherein the gain control signal is generated by:
based on the estimate of the rate of change of the temperature of the voice coil, setting a threshold power value,
based on the threshold power value and on the estimate of the temperature of the voice coil, setting an allowed power value, and
based on the allowed power value and the estimate of power dissipation in the voice coil, generating the gain control signal for modulating the gain applied to the input signal in the signal path between the input terminal and said loudspeaker.

\* \* \* \* \*

UNITED STATES PATENT AND TRADEMARK OFFICE
CERTIFICATE OF CORRECTION

PATENT NO. : 10,219,074 B2  
APPLICATION NO. : 15/878659  
DATED : February 26, 2019  
INVENTOR(S) : Napoli et al.

Page 1 of 4

It is certified that error appears in the above-identified patent and that said Letters Patent is hereby corrected as shown below:

In the Drawings

1. In Fig. 9, Sheet 8 of 14, delete "Temparature" and insert -- Temperature --, therefor. (See attached sheet)

2. In Fig. 12a, Sheet 12 of 14, for Step "1007", in Line 1, delete "Din" and insert -- $D_{in}$ --, therefor. (See attached sheet)

In the Specification

3. In Column 1, Line 58, delete "$C_{thm}$," and insert -- $C_{thm}$ --, therefor.

4. In Column 6, Line 19, delete "$T_{vc2}=P_B.R_{thvcm}+T_{m1}\ T_{m1}$" and insert -- $T_{vc2}=P_B.R_{thvcm}+T_{m1}$ --, therefor.

5. In Column 9, Line 14, delete "where a" and insert -- where α --, therefor.

6. In Column 11, Line 55, delete "circuitry)" and insert -- circuitry --, therefor.

7. In Column 15, Line 1, delete "$T_c$," and insert -- $T_Q$, --, therefor.

8. In Column 16, Line 9, delete "Plow" and insert -- $P_{low}$ --, therefor.

9. In Column 17, Line 1, delete "Tth" and insert -- Tthr --, therefor.

10. In Column 18, Line 6, delete "$G_{tgt}=G_{nom}*Sqrt(P_{all}/P_d)$," and insert -- $G_{tgt}=G_{nom}*sqrt(P_{all}/P_d)$, --, therefor.

11. In Column 20, Line 10, delete "$Tt_{th}$ to $T_{max}$" and insert -- $T_{th}$ to $T_{max}$ --, therefor.

12. In Column 20, Line 16, delete "$P_a$" and insert -- $P_{all}$ --, therefor.

Signed and Sealed this  
First Day of October, 2019

Andrei Iancu  
*Director of the United States Patent and Trademark Office*

13. In Column 21, Lines 33-34, delete "excursion controller 1102" and insert -- excursion controller 1101 --, therefor.

14. In Column 22, Line 59, delete "Din" and insert -- $D_{in}$ --, therefor.

15. In Column 22, Line 65, delete "(to" and insert -- to --, therefor.

16. In Column 23, Line 56, delete "hardware" and insert -- hardware. --, therefor.